(12) United States Patent
Vintila et al.

(10) Patent No.: US 12,215,804 B2
(45) Date of Patent: Feb. 4, 2025

(54) COOLING OF AIR ACTUATED VALVE USING ACTUATING AIR

(71) Applicant: Lam Research Corporation, Fremont, CA (US)

(72) Inventors: Adriana Vintila, Wilsonville, OR (US); Matthew Scott Mudrow, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 24 days.

(21) Appl. No.: 17/610,420

(22) PCT Filed: May 14, 2020

(86) PCT No.: PCT/US2020/032837
§ 371 (c)(1),
(2) Date: Nov. 10, 2021

(87) PCT Pub. No.: WO2020/236504
PCT Pub. Date: Nov. 26, 2020

(65) Prior Publication Data
US 2022/0213979 A1    Jul. 7, 2022

Related U.S. Application Data

(60) Provisional application No. 62/849,434, filed on May 17, 2019.

(51) Int. Cl.
*F16K 49/00*     (2006.01)
*F16K 27/02*     (2006.01)
(Continued)

(52) U.S. Cl.
CPC .............. *F16K 49/00* (2013.01); *F16K 27/02* (2013.01); *F16K 31/1223* (2013.01); *F16K 24/04* (2013.01)

(58) Field of Classification Search
CPC ...... F16K 31/12; F16K 31/122; F16K 43/008; F16K 49/00; F16K 1/44; F16K 1/443; F16K 1/446; F16K 49/005; F16K 27/02
(Continued)

(56) References Cited

U.S. PATENT DOCUMENTS

| 735,144 A | * | 8/1903 | Porter | F16K 31/122 |
| | | | | 92/135 |
| 1,334,612 A | * | 3/1920 | Irving | F23D 11/46 |
| | | | | 251/63.5 |

(Continued)

FOREIGN PATENT DOCUMENTS

| JP | 11-294630 A | 10/1999 |
| JP | 11-304022 A | 11/1999 |

OTHER PUBLICATIONS

ISR & Written Opinion PCT/US2020/032837, dated Aug. 21, 2020, 12 pages.

*Primary Examiner* — Kevin F Murphy
*Assistant Examiner* — Jonathan J Waddy
(74) *Attorney, Agent, or Firm* — PENILLA IP, APC

(57) ABSTRACT

A valve including a valve body. An actuation housing of the valve body surrounds an actuation cavity. The actuation housing includes a first port configured for entry of actuating air and a second port configured for exhausting the actuating air. A poppet is configured for movement within the valve body and includes a barrier located within the actuation cavity. The poppet being actuated to an open position using the actuating air entering in the first port. When the poppet is in the open position, the actuating air flowing between the first port and the second port cools the stem.

17 Claims, 14 Drawing Sheets

(51) Int. Cl.
*F16K 31/122* (2006.01)
*F16K 24/04* (2006.01)

(58) Field of Classification Search
USPC ........ 137/334, 338, 340; 251/36, 48, 52, 62, 251/63, 63.5
See application file for complete search history.

(56) References Cited

U.S. PATENT DOCUMENTS

| | | | | |
|---|---|---|---|---|
| 1,551,234 A * | 8/1925 | Box | ........................ | F01B 25/00 251/63 |
| 1,724,079 A * | 8/1929 | Goldberg | .............. | F16K 31/363 137/487 |
| 1,786,474 A * | 12/1930 | Bickel | ..................... | B60T 17/02 91/394 |
| 3,683,954 A * | 8/1972 | Press | ..................... | F16K 43/008 137/329.06 |
| 3,884,251 A * | 5/1975 | Knight | .................... | F16K 17/30 251/63.4 |
| 4,453,699 A * | 6/1984 | Hulsey | .................... | F16K 3/182 251/63.4 |
| 4,552,330 A * | 11/1985 | Grotloh | .................. | F01D 21/20 251/30.01 |
| 5,305,788 A * | 4/1994 | Mayeux | ............. | G01N 35/1097 137/583 |
| 5,678,595 A * | 10/1997 | Iwabuchi | ................ | F16K 51/02 137/341 |
| 6,550,743 B2 * | 4/2003 | Rountree | .............. | F15B 15/149 251/30.01 |
| 6,805,152 B2 * | 10/2004 | Kanzaka | ............. | F16K 31/122 137/341 |
| 8,196,893 B2 * | 6/2012 | Grout | ...................... | F16K 51/02 251/63 |
| 9,200,721 B2 | 12/2015 | Miyashita et al. | | |
| 2005/0006610 A1 * | 1/2005 | Sakurai | ............. | F16K 31/1221 251/63.6 |
| 2005/0145278 A1 * | 7/2005 | Igawa | ................ | F16K 31/1268 137/486 |
| 2005/0242312 A1 * | 11/2005 | Kajitani | .................... | F16K 1/54 251/63.6 |
| 2016/0052184 A1 * | 2/2016 | Galati | ................... | F16K 31/122 251/28 |
| 2016/0169062 A1 | 6/2016 | Knudsen | | |
| 2017/0292633 A1 * | 10/2017 | Hill | ............................ | F16K 1/22 |
| 2017/0363053 A1 | 12/2017 | Ichihashi et al. | | |
| 2018/0072117 A1 * | 3/2018 | Kunau | .................. | B60C 25/138 |
| 2021/0262583 A1 * | 8/2021 | Kobayashi | .......... | F16K 31/1221 |

* cited by examiner

COOLING OF AIR ACTUATED VALVE USING ACTUATING AIR

Claim of Priority

This application is a national stage filing of and claims priority, under 35 U.S.C. § 371, to PCT/US2020/032837, filed on May 14, 2020, and titled "COOLING OF AIR ACTUATED VALVE USING ACTUATING AIR", which claims priority, under 35 U.S.C. § 119 (e), to U.S. Provisional Application No. 62/849,434, filed on May 17, 2019, and titled "COOLING OF AIR ACTUATED VALVE USING ACTUATING AIR", both of which are incorporated by reference herein in their entireties.

TECHNICAL FIELD

The present embodiments relate to a valve for controlling flow of a fluid. In particular, the valve includes an actuation housing configured for actuating a poppet using actuation air. The valve is configured for cooling, such that when the poppet is in the open and/or closed position, actuating air flowing between the first port and the second port cools the stem.

BACKGROUND OF THE DISCLOSURE

Many modern semiconductor fabrication processes are performed in plasma process modules in which a substrate is held on a substrate holder when exposed to a plasma. Deposition of thin films is one of the key processes in semiconductor manufacturing. A typical wafer goes through deposition of several thin films, some of which may completely or partially remain in the final electronic device, while others may only temporarily remain on the wafer and serve some intermediate processing needs. For example, an ashable hard mask film may be used as an etch hardmask layer. Such film is first deposited on a wafer and then partially removed to define circuit line patterns. An etchant is then applied to remove some of the underlying dielectric forming trenches and vias for the future circuit lines. Eventually, all remaining ashable hard mask films are removed from the wafer. Various deposition processes are used to deposit thin films. For example, an ashable hard mask film may be deposited using chemical vapor deposition (CVD), or more specifically plasma enhanced chemical vapor deposition (PECVD), processes.

One consequence of almost any deposition process is that the film material is not only deposited onto the wafer but also on the interior surfaces of the deposition chambers, thereby forming residues. These residues can build up over time and dissolve, detach or otherwise disperse through the deposition chamber causing contamination. The built-up residues are periodically removed to avoid such contamination. A remote plasma clean (RPC) process may be performed to deliver plasma-activated species included in a cleaning reagent mixture to a deposition chamber. The cleaning reagent mixture is generated in a remote plasma generator separate from the deposition chamber and delivered through an RPC delivery system. After delivery, the plasma-activated species in the deposition chamber etch the deposition residue for removal.

However, recombination of activated species while flowing to the deposition chamber may occur. Recombination generates excessive heat within the RPC delivery system, which may lead to failure in the system. For example, the heat may reduce the usable lifetime of seals within the RPC delivery system, wherein the seals may be configured to isolate the RPC delivery system from the deposition chamber during processing operations (e.g., deposition). Failure of the seals may allow for process gases to escape from the deposition chamber and travel through the RPC delivery system disabling the benefit of the isolation valve and adversely affecting process conditions.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure It is in this context that embodiments of the disclosure arise.

SUMMARY

The present embodiments relate to solving one or more problems found in the related art, and specifically to include a valve for controlling fluid flow, wherein the valve in an open and/or closed position is configured for an internal flow of actuating air to cool interior components of the valve. Several inventive embodiments of the present disclosure are described below.

Embodiments of the present disclosure include a valve. The valve includes an actuation housing of a valve body and surrounding an actuation cavity, the actuation housing including a first port configured for entry of actuating air, and a second port configured for exhausting the actuating air. A poppet is configured for movement within the valve body and including a barrier located within the actuation cavity, the poppet being actuated to an open position using the actuating air entering in the first port. When the poppet is in the open position, the actuating air flowing between the first port and the second port cools the stem.

Other embodiments of the present disclosure include a method for operating a valve. The method includes providing actuating air to a first port of an actuation housing of a valve body of the valve. The actuation housing surrounds an actuation cavity. A poppet is configured for movement within the valve body and includes a barrier located within the actuation cavity. The method includes actuating the poppet to an open position using the actuating air entering the first port. The method includes exhausting the actuating air entering from the first port to atmosphere through a second port of the actuation housing when the poppet is in the open position. The method includes cooling the stem using actuating air flowing between the first port and a second port of the actuation housing.

Other embodiments of the present disclosure include a valve suitable for use with a process chamber. The valve includes a valve body configured for controlling flow of plasma from a remote source (e.g., remote plasma clean, RPC, source) to the process chamber. The valve includes a sealing cavity of the valve body surrounding a sealing cavity. The sealing housing includes an inlet port configured for entry of the plasma and an outlet port configured for providing access to the process chamber from the sealing cavity. The valve includes an actuation housing surrounding an actuation cavity. The actuation housing includes a common wall separating the sealing cavity from the actuation cavity, a first port configured for entry of actuating air, and a second port configured for exhausting the actuating air. The valve includes a poppet configured for movement within the valve body. The poppet includes a stem connecting a sealing plunger located within the sealing cavity to a barrier located within the actuation cavity through a first opening in the common wall. The poppet being actuated to an open position using the actuating air entering in the first port.

Other embodiments of the present disclosure include a method for cleaning a process chamber. The method includes actuating a valve using actuating air to an open position. The method includes providing a plasma from a remote source (e.g., remote plasma clean, RPC, source) to the valve configured for controlling flow of the plasma to the process chamber. The method includes exhausting the actuating air from the valve to atmosphere when the valve is in the open position to cool the valve.

Still other embodiments of the present disclosure include a cleaning system for cleaning a process chamber configured for depositing a film on the wafer. The cleaning system includes the plasma processing chamber that further includes a pedestal configured for supporting the wafer. The cleaning system includes a shower head configured for directing process gases towards the wafer. The cleaning system includes a remote source (e.g., remote plasma clean, RPC, source) for generating plasma. The cleaning system includes a valve for controlling flow of the plasma to the process chamber. The valve includes a valve body configured for controlling flow of the plasma to the process chamber. The valve includes a sealing cavity of the valve body surrounding a sealing cavity. The sealing housing includes an inlet port configured for entry of the plasma and an outlet port configured for providing access to the process chamber from the sealing cavity. The valve includes an actuation housing surrounding an actuation cavity. The actuation housing includes a common wall separating the sealing cavity from the actuation cavity, a first port configured for entry of actuating air, and a second port configured for exhausting the actuating air. The valve includes a poppet configured for movement within the valve body. The poppet includes a stem connecting a sealing plunger located within the sealing cavity to a barrier located within the actuation cavity through a first opening in the common wall. The poppet being actuated to an open position using the actuating air entering in the first port.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

DETAILED DESCRIPTION

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems and methods for cooling a valve using actuation air. In particular, piston valves actuated using actuation air (e.g., compressed dry air—CDA) are cooled using actuation air in order to cool internal components of the valve, thereby extending the life of the valve when exposed to high temperatures. Specifically, actuating air is used to cool a stem of the valve that is in direct contact with the housing of one or more seals. In that manner, embodiments of the present disclosure provide for localized cooling of the stem, which allows for all seals installed on the stem or adjacent to the stem to operate at lower temperatures. In addition, cooling of the stem of the valve using actuating air is sufficient for cooling the components of the valve. As such, no additional cooling agents or systems to cool the valve, are needed. Further, embodiments of the present disclosure provide for close control of the cooling time during which the valve is cooled.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

Figure 1A:
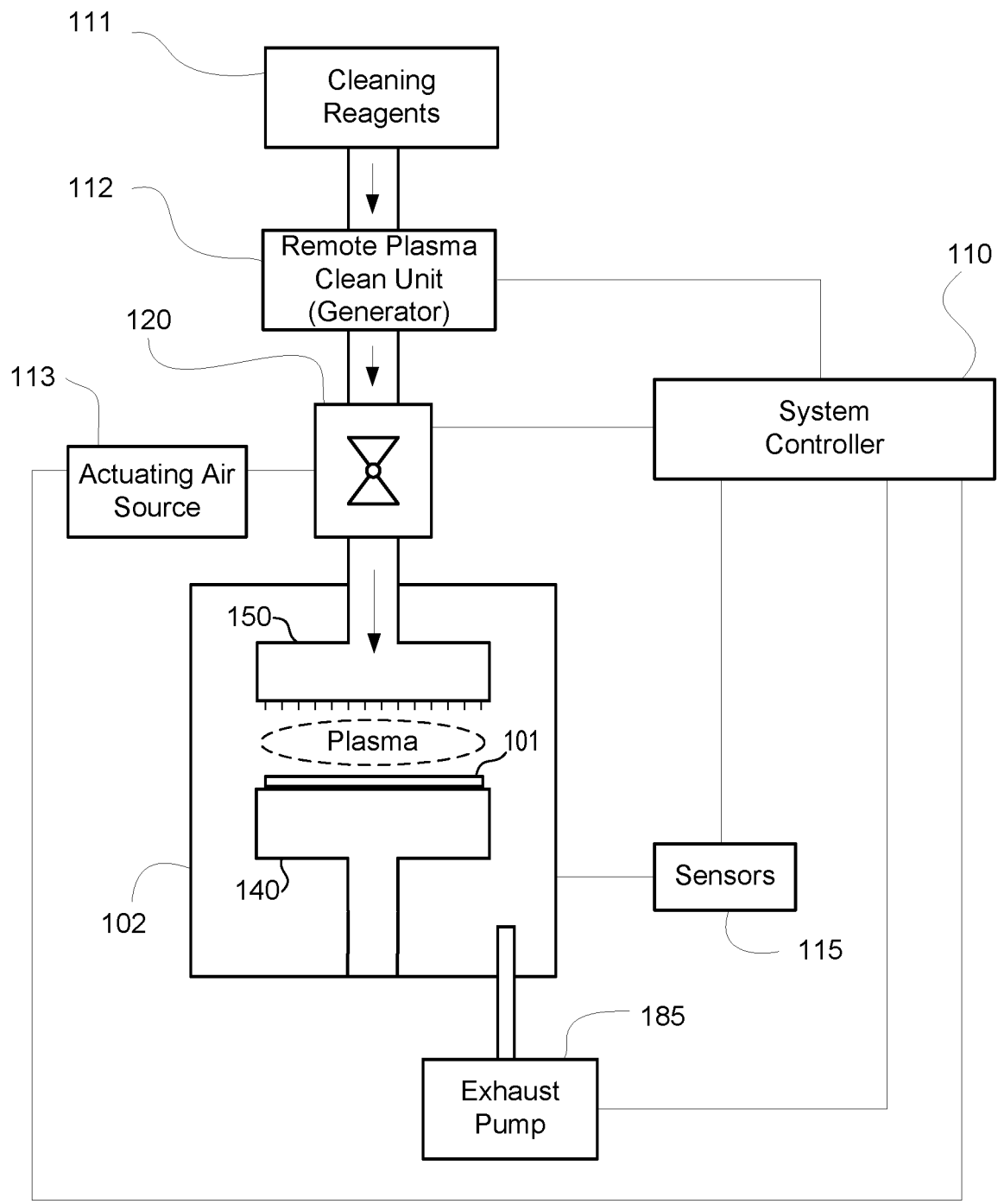
FIG. 1A illustrates an overall system including a process chamber suitable for use in depositing a film on a wafer and/or substrate, and a cleaning apparatus that is configured to remove residue from interior surfaces of the reactor system.

FIG. 1A illustrates a plasma processing system 100 including a process chamber 102 suitable for use in performing one or more plasma processing operations (e.g., depositing a film on a wafer and/or substrate, atomic layer deposition (ALD) etching, clean, etc.), and an RPC cleaning system that is configured to remove residue from interior surfaces of the process chamber 102. In one embodiment, a valve 120 actuated using actuating air may be implemented within the reactor system 100 for purposes of isolating the RPC path.

FIG. 1A is shown merely to illustrate one use case of valve 120 (e.g., wafer fabrication in plasma processing modules), wherein actuating air may be used to cool one or more components of valve 120 during operation (e.g., clean process). In other embodiments, valve 120 may be implemented within any system that exposes the valve 120 to high temperatures, such that actuating air may be used to cool valve 120 under high temperatures to lower the operating temperature of the valve 120 and to extend the lifetime of valve 120.

More particularly, FIG. 1A illustrates a plasma processing system 100, which is used to process a wafer 101. For example, plasma processing modules may be used in plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, a plasma enhanced chemical vapor deposition (PECVD) chamber or module, an atomic layer etch (ALE) chamber or module, an ion implantation chamber or module, a track chamber or module, and any other semiconductor processing systems that may be associated or used in the fabrication and/or manufacturing of semiconductor wafers to include processes such as electroplating, electroetching, electropolishing, electro chemical mechanical polishing, deposition, wet deposition, and through silicon via (TSV) processes.

In the embodiment of FIG. 1A, the term "substrate" as used herein refers to a semiconductor wafer in embodiments of the present disclosure. However, it should be understood that in other embodiments, the term substrate can refer to substrates formed of sapphire, GaN, GaAs or SiC, or other substrate materials, and can include glass panels/substrates, metal foils, metal sheets, polymer materials, or the like.

The process chamber 102 includes a pedestal 140. A semiconductor substrate 101 is shown disposed over pedestal 140. A shower head 150 is used to supply process gases utilized to create and generate a plasma in chamber 102. During plasma processing (e.g., deposition, etching, etc.), one or more gases are supplied to the process chamber 102 depending on the process recipe being performed. Controller 110 is used to provide instructions to the various components of the reactor system 100, including facilities as gas supply 114, pressure controls, temperature controls, and other processing parameters. Sensors 115 may be configured to sense various control parameters of the plasma processing system used for process control (e.g., deposition, clean, etc.).

For example, controller 110 may execute process input and control 108 to include process recipes, such as power levels, timing parameters, process gasses, mechanical movement of the wafer 101, etc., such as to deposit or form films over the wafer 101. Depending on the processing being performed, the control module 110 controls the delivery of process gases. The chosen gases are then flown into the shower head 150 and distributed in a space volume defined between the shower head 150 face that faces that wafer 101 and the wafer 101 resting over the pedestal 140. Appropriate valving and mass flow control mechanisms may be employed to ensure that the correct gases are delivered during the deposition and plasma treatment phases of the process. Process gases exit chamber via an outlet. A vacuum pump 185 draws process gases out and maintains a suitably low pressure within the reactor by a close loop controlled flow restriction device, such as a throttle valve or a pendulum valve.

The substrate processing system 100 may be configured for cooling valve 120 (e.g., isolation valve configured for controlling flow of RPC plasma to a process chamber). For example, controller 110 may control actuation of valve 120 to control isolation of valve 120 from chamber 102 during plasma processing, or to introduce cleaning reagents into chamber 102 during a clean operation, and/or for cooling the valve 120 during the clean operation using actuating air. As shown in FIG. 1A, actuating air (e.g., CDA) piston actuated valves are cooled using actuating air in order to protect seals configured for isolating chambers of the valve from the process chamber from high temperature conditions, thereby extending the life of the valve 120. High temperatures exposed to the valve 120 may be due in part to plasma (e.g., from an RPC source) recombination in chambers of the valve 120, and/or heat generated within the process chamber during a clean operation or any other plasma processing operation.

Generally, actuating air (e.g., CDA) is used to cool a stem of the valve 120 that is in direct contact with the housing of one or more seals, in one embodiment. In that manner, embodiments of the present disclosure provide for localized cooling of the stem, which allows for all seals installed on the stem or adjacent to the stem to operate a lower temperatures. In addition, cooling of the stem of the valve 120 using actuating air (e.g., CDA) is effective for cooling the components of the valve 120. For example, effective cooling is provided using actuating air such that the substrate processing system 100 of FIG. 1A does not require any additional cooling agents or systems to cool the valve 120, such as during a clean operation. Further, embodiments of the present disclosure provide for close control of the cooling time during which valve 120 is cooled, as will be described below.

A remote plasma clean (RPC) cleaning system may be configured to remove residue from interior surfaces of the process chamber 102. The valve system 200 may be controlled using control module 110, or in combination with another controller to control process conditions during a cleaning operation. For example, cleaning reagents 111 and optionally inert gases are introduced via RPC unit 112 (e.g., RPC generator) into the process chamber 102 that react with residue (e.g., formed during deposition) and form volatile products, which are pumped out of the chamber 102 using exhaust pump 185.

To expedite the clean process, cleaning reagents 111 are activated in a remote plasma clean (RPC) unit 112 to form cleaning reagent radicals, ions, and high energy atoms and molecules, which form a more reactive cleaning mixture (e.g., more reactive with the residue) than the more stable cleaning reagents 111.

RPC unit 112 may include a high power radio frequency (RF) generator providing energy to dissociate the cleaning reagents into radicals in RPC unit 112, which then form reactive atoms and ions, which are then used to etch the residue. For example, fluorine containing cleaning reagents may be introduced in RPC unit 112, which is remote from or external from the process chamber 102, to generate plasma (e.g., a cleaning mixture) including activated species of cleaning reagents used for cleaning the process chamber 102. RPC unit 112 may be a self-contained device generating weakly ionized plasma using the cleaning reagents 111.

After passing through the RPC unit 112, the plasma or cleaning mixture is introduced into the process chamber 102 for cleaning, which may involve flowing the plasma through a distribution path connecting the RPC unit 112 and the process chamber 102, wherein the plasma may be introduced into the process chamber 102 through shower head 150. The distribution path includes valve 120 (e.g., isolation valve) that is configured for controlling flow of plasma to the process chamber 102, and more particularly for isolating the RPC unit 112 from the process chamber 102. In one embodiment, the actuating air is compressed dry air (CDA), wherein source 113 is a CDA source. The plasma (cleaning mixture) reacts with residue in the interior of the process chamber 102 to form volatile compounds. Remaining unreacted mixture, inert gases, and the volatile compounds are then evacuated from the chamber 102 using exhaust pump 185, for example.

The RPC unit 112 provides a high degree of activation of cleaning reagents 111, but many of these activated species may go back to their neutral state before reaching the process chamber 102. For example, activated cleaning reagents may recombine while flowing to the process chamber, such as recombining in the valve 120. In particular, the activated cleaning reagents may include neutral fluorine radicals, portions of which may recombine into a non-reactive form along the distribution path to the process chamber 102. During recombination, heat may be generated. Recombination within the valve 120 may produce excessive heat, that left untreated may excessively increase the operating temperature of the valve 120 leading to premature damage of the valve 120, to include one or more seals configured to isolate plasma and/or gases within the process chamber 102 from actuating air source 113. For example, the seals (e.g., O-rings) may be formed from perfluoro-elastomer (FFKM) which break down under extreme temperatures. In addition, heat may damage other components, such as an optional optical sensor (not shown) configured for sensing the position and/or state of valve 120.

For purposes of illustration, a clean process cycle may range between 5 to 15 minutes. One to three consecutive clean process cycles may be performed, wherein the entire period for the clean process (e.g., one or more clean process cycles) may range between 5 to 30 minutes in one implementation, 5 to 20 minutes in another implementation, 5 to 15 minutes, as examples. For purposes of illustration, the operating temperature of the valve 120 (e.g., within the sealing cavity 250) and/or the process chamber during a clean process (e.g., one or more clean process cycles) may be approximately 50-300 degrees Celsius, in some implementations. In other implementations, the operating temperature of the valve 120 and/or the process chamber during a clean process may be approximately 100-250 degrees Celsius. In other implementations, the operating temperature of the valve 120 and/or the process chamber during a clean process may be approximately 100-200 degrees Celsius. In another implementation, the operating temperature of the valve 120 and/or the process chamber during a clean process may be approximately 200 degrees Celsius. Still higher temperatures may be introduced in isolated areas of the isolation valve.

Figure 1B:
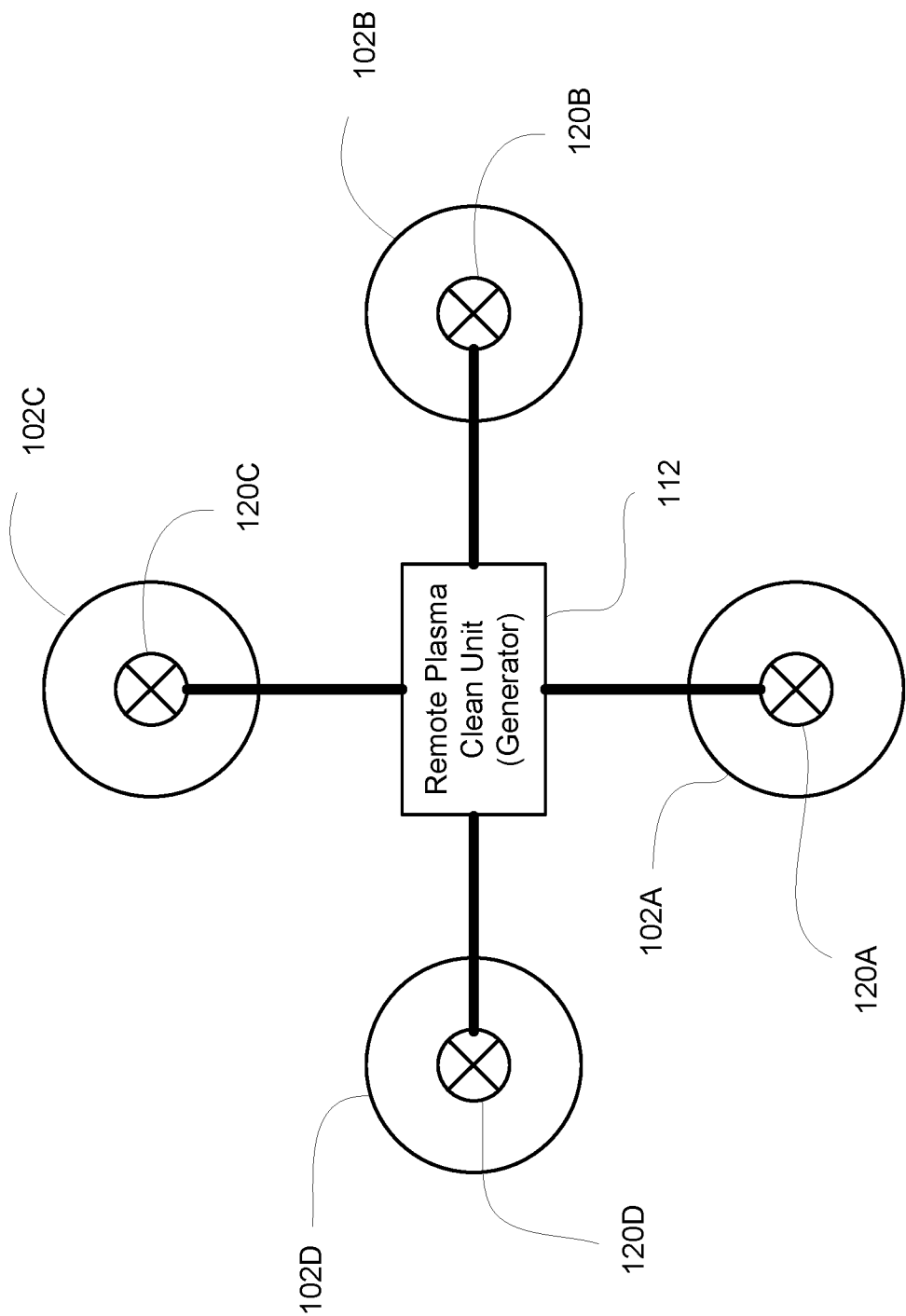
FIG. 1B is a top view of a multi-station processing tool, wherein each processing tool includes a cleaning apparatus configured to remove residue for interior surfaces of corresponding processing stations and/or process chambers, in accordance with one embodiment of the present disclosure.

FIG. 1B is a top view of a multi-station processing tool, wherein each processing station may include a corresponding RPC cleaning system configured to remove residue for interior surfaces of corresponding processing stations and/or process chambers, in accordance with one embodiment of the present disclosure. Some components of each RPC cleaning system may be shared between stations. For example, the RPC unit 112 may support one or more process chambers 102. In one embodiment, RPC unit 112 may support one or more (e.g., four) plasma processing systems and/or stations. As shown, each plasma processing system includes a corresponding valve 120 (e.g., isolation valve) connected to the RPC unit 112, wherein the isolation valve is configured to control flow of plasma (cleaning mixture) to the corresponding process chamber 102. For example, the RPC unit 112 delivers plasma to process chamber 102A via valve 120A of a first station, delivers plasma to process chamber 102B via valve 120B of a second station, delivers plasma to process chamber 102C via valve 120C of a third station, and delivers plasma to process chamber 102D via valve 120D of a fourth station.

Figure 2A:
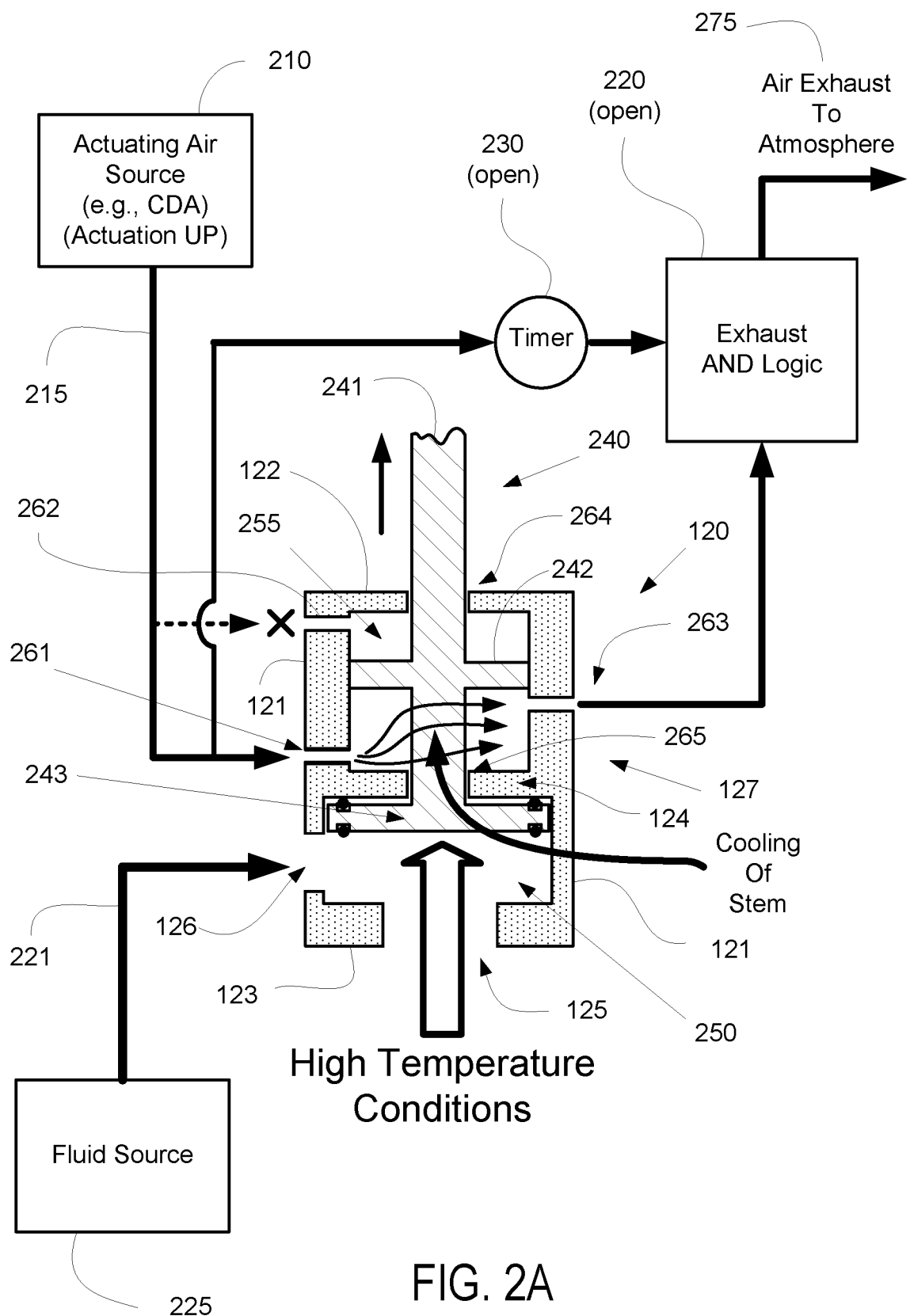
FIG. 2A is a diagram of a valve system configured for controlling fluid flow, wherein the valve is in an open position, and wherein an actuating air flow cools the valve, in accordance with one embodiment of the present disclosure.

FIG. 2A is a diagram of a valve system 200 configured to control (e.g., isolate) flow of a fluid 221, in accordance with one embodiment of the present disclosure. The valve system 200 includes valve 120 configured for controlling flow of fluid 221. As shown in FIG. 2A, the valve 120 is actuated to an open position using actuating air 215 from an air source 210. In one embodiment, the actuating air is compressed dry air (CDA). When the valve 120 is in an open position, the actuating air continues to flow and cools the valve 120 during a clean operation, in accordance with one embodiment of the present disclosure.

The valve includes a valve body 127 configured for controlling flow of a fluid 221. The valve body 127 includes a top cap 122 and a bottom cap 123. A containing wall 121 connects the top cap 122 and the bottom cap 123.

The valve 120 includes a sealing housing 127b of the valve body 127 configured for surrounding a sealing cavity 250, which is located in the bottom portion of the valve. The sealing housing 127b includes a fluid inlet port 126 and a fluid outlet port 125. Fluid inlet port 126 of the sealing housing 127b is located in containing wall 121 and is configured for entry of the fluid 221 from the fluid source 225. As previously described, fluid 221 is generated by fluid source 225 for distribution as controlled by valve 120. Fluid outlet port 125 of the sealing housing 127b of the valve body 127 is located in bottom cap 123. The fluid outlet port 125 is configured for delivery of fluid 221 to an intended target via the sealing cavity 250. When the valve is in an open position, fluid 221 enters the sealing cavity 250 through fluid inlet port 126, and exits through fluid outlet port 125 located in the bottom cap 123 for delivery to the target.

The valve body 127 includes an actuation housing 127a surrounding an actuation cavity 255. The actuation housing 127a includes a common wall 124 separating the sealing cavity 250 from the actuation cavity 255. The actuation housing 127a includes an opening (e.g., first opening) 265 in the common wall 124 that is configured to provide access between the sealing cavity 250 and the actuation cavity 255. Further, actuation housing 127a includes another opening (e.g., second opening) 264 that is configured within the top cap 122. In one embodiment, the stem 241 may extend from barrier 242 through opening 264, for example during movement of the stem 241. The second opening 264 is aligned with the first opening 265 for travel of stem 241 through openings 264 and 265, in one embodiment.

Also, the actuating housing 127a includes a first port 261 configured for entry of actuating air, and a second port 263 configured for exhausting the actuating air. The first port is configured within the containing wall 121, and is configured for entry of actuating air 215 delivered from the air source 210, wherein actuating air 215 is used to move the valve 120 to the open position. In one embodiment, actuating air is CDA. The second port 263 (e.g., exhaust port) is located within the containing wall 121, and is configured to allow actuating air 215 to exhaust from the actuation cavity 255 as air exhaust 275.

The valve includes a poppet 240 configured for movement within the valve body 127. In particular, poppet 240 includes a stem 241 configured for connecting a sealing plunger 243 to a barrier 242. The stem 241 connects the sealing plunger 243 located within the sealing cavity 250 to the barrier 242 located within the actuation cavity 255 through a first opening 265 in the common wall 124. The poppet 240 is actuated to an open position using the actuating air 215 entering in the first port 261.

Specifically, the poppet 240 is configured for linear movement within the valve body 127, as actuated by actuating air 215 provided by the air source 210. In FIG. 2A, the valve 120 is moved to an open position by actuating air 215, as delivered to the first port 261 through the accommodating piping/delivery system for UP actuation. In particular, the barrier 242 is configured for linear movement within the actuation cavity 255, as actuated by actuating air 215. Linear movement of the barrier 242 is translated to linear movement of the sealing plunger 243 within the sealing cavity 250 via the stem 241, wherein the stem 241 is configured for travel through the first opening 265.

Figure 3A:
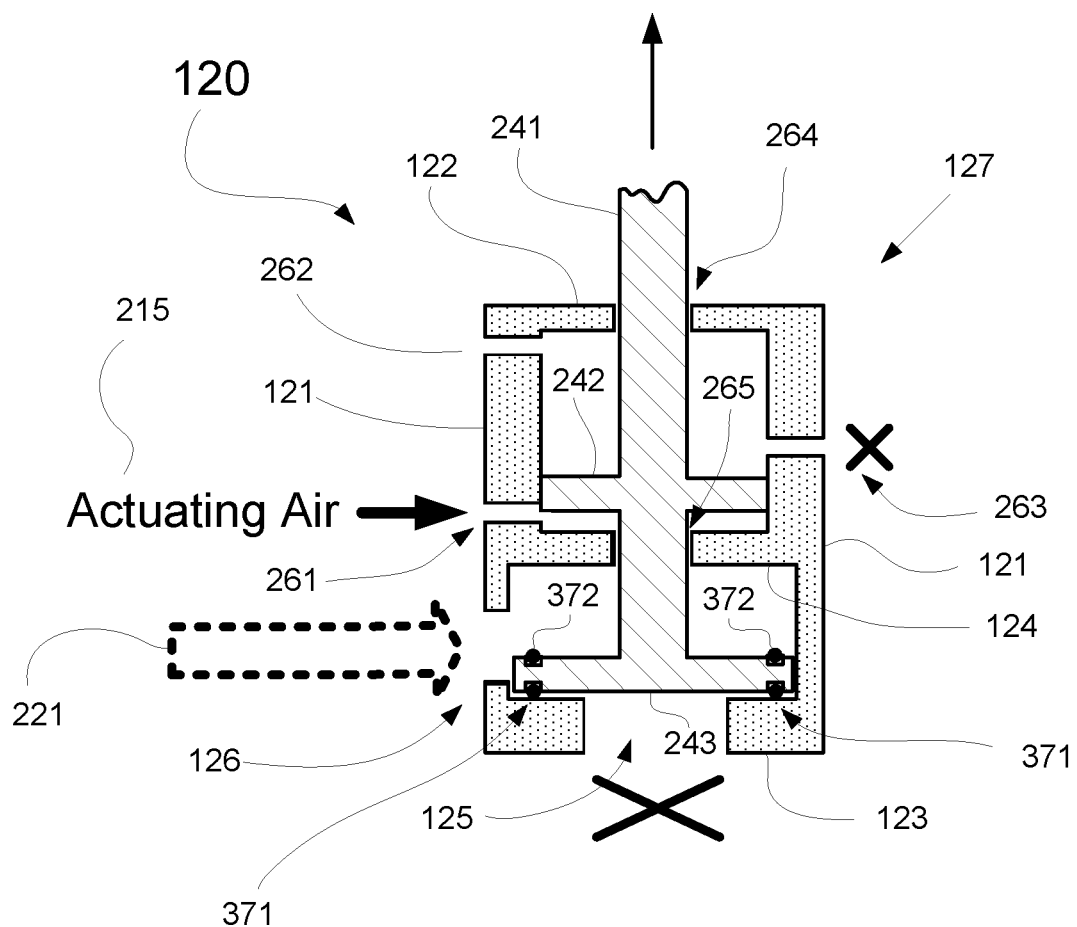
FIGS. 3A-3C are illustrations of a valve controlling fluid flow as the valve is moving to an open position as described in FIG. 2A, in accordance with one embodiment of the present disclosure.
Figure 3B:
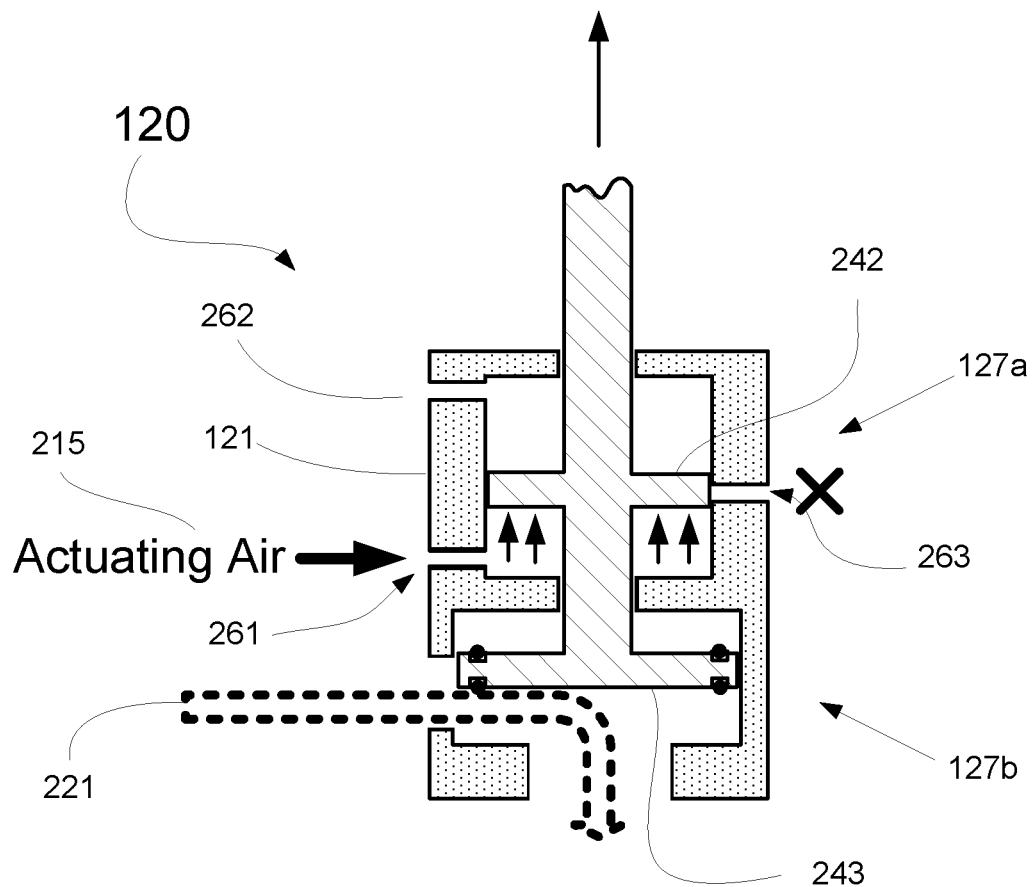
Figure 3C:
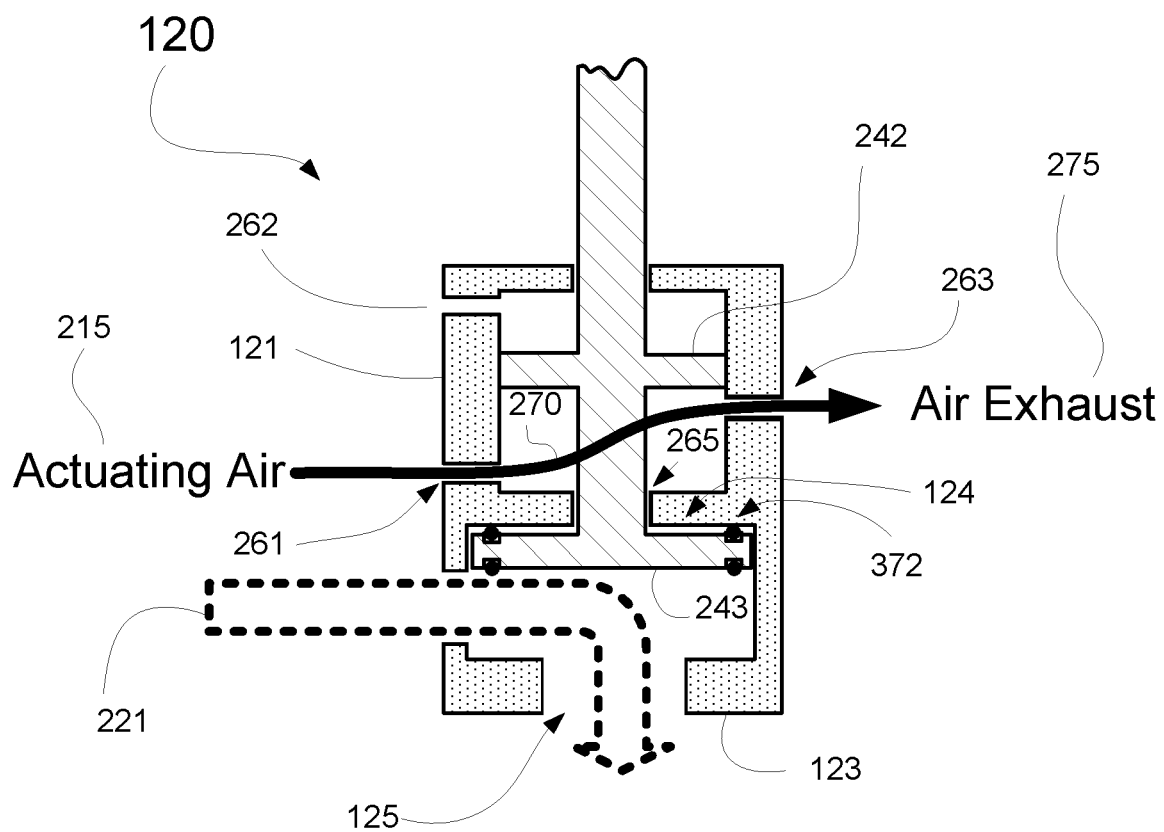

As shown in FIG. 2A, when the valve 120 is in the open position, the barrier 242 is pushed and/or linearly moved towards top cap 122 by actuating air 215, as will be further described in relation to FIGS. 3A-3C. In that manner, sealing plunger 243 is linearly moved to rest against the common wall 124. In one embodiment, the state of the valve 120 is maintained without continuous flow of actuation air. For example, the state of poppet 240 (e.g., open or closed position) within the valve body 127 remains static (e.g., through friction). As such, when the barrier 242 is similarly in the open position, the sealing plunger 243 is positioned to seal the first opening 265 from the sealing cavity 250, and allow flow of fluid 221 through the sealing cavity 250 from the fluid inlet port 126 to the fluid outlet port 125. More particularly, when the barrier 242 is similarly in the open position, actuating air 215 continues to flow through the actuation cavity 255 between the first port 261 and the second port 263 (e.g., exhaust port). In one embodiment, cooling flow 270 of the actuating air within the actuation cavity 255 cools the stem 241. The cooling flow 270 may be controlled for optimal cooling, such as duration of cooling flow 270, pressure of cooling flow 270, start time of cooling flow 270, end time of cooling flow 270. Cooling of the stem 241 lowers the operating temperature of the poppet 240, and more particularly lowers the temperature of the stem and components in contact with the stem 241, such as sealing O-rings.

In one embodiment, the configuration of the first port 261 and the second port 263 (e.g., exhaust port) allows for full actuation of the valve 120 to the open position before fully exhausting the actuating air as air exhaust 275 through the second port 263. If additional actuating air 215 is necessary to fully actuate the poppet 240 and/or valve 120 to the open position, timer 230 and exhaust logic 220 are configured to control the exhausting of the actuating air 215 to the atmosphere as air exhaust 275. In particular, exhaust logic 220 may be configured as AND logic, with a first input being actuating air 215 from the air source 210 and a second input being the air exhaust 275 from the second port 263 (e.g., exhaust port). When the exhaust logic 220 receives both inputs as being true (i.e., receives both actuating air 215 and air exhaust 275), then the exhaust logic 220 opens to allow the air exhaust 275 to the atmosphere. On the other hand, when the exhaust logic 220 only receives one input as being true, then the exhaust logic 220 remains closed, and air exhaust 275 is preventing from exhausting to the atmosphere.

In one embodiment, a timer 230 (optional) controls the delivery of actuating air 215 from the air source 210 to the exhaust logic 220. That is, timer 230 is configured to control cooling (e.g., start and end of cooling, the cooling period, etc.), and does not impede actuation. Timer 230 controls how long to prevent actuating air 215 from being received as an input to exhaust logic 220. In one implementation, as long as the timer is activated and has not expired, actuation air 215 is prevented from flowing as input to exhaust logic 220. In some implementations, even though the second port 263 is exposed to the actuation cavity 255 below the barrier 242 thereby allowing actuating air 215 to exhaust, when the exhaust logic 220 is closed to prevent air exhaust 275 to flow to atmosphere (e.g., channel leading to atmosphere is stagnant), the pressure under barrier 242 in cavity 255 is maintained at the pressure of actuating air presented to exhaust logic 220. For example, it may be desired to allow for a longer period for actuating air 215 to actuate the poppet 240 to the fully open position. Also, it may be desired to delay cooling of the stem 241 by preventing actuating air 215 to exhaust to atmosphere through exhaust logic 220 (e.g., remains closed through operation of timer 230). Once the exhaust logic 220 opens, the actuating air 215 flows through the actuation cavity as cooling flow 270 to cool the stem 241, exits as air exhaust 275, and passes through the exhaust logic 220 to the atmosphere. In another embodiment, timer 230 controls delivery of air exhaust 275 from the air exhaust port 263, instead of controlling actuating air 215 as input to the exhaust logic 220.

Figure 2B:
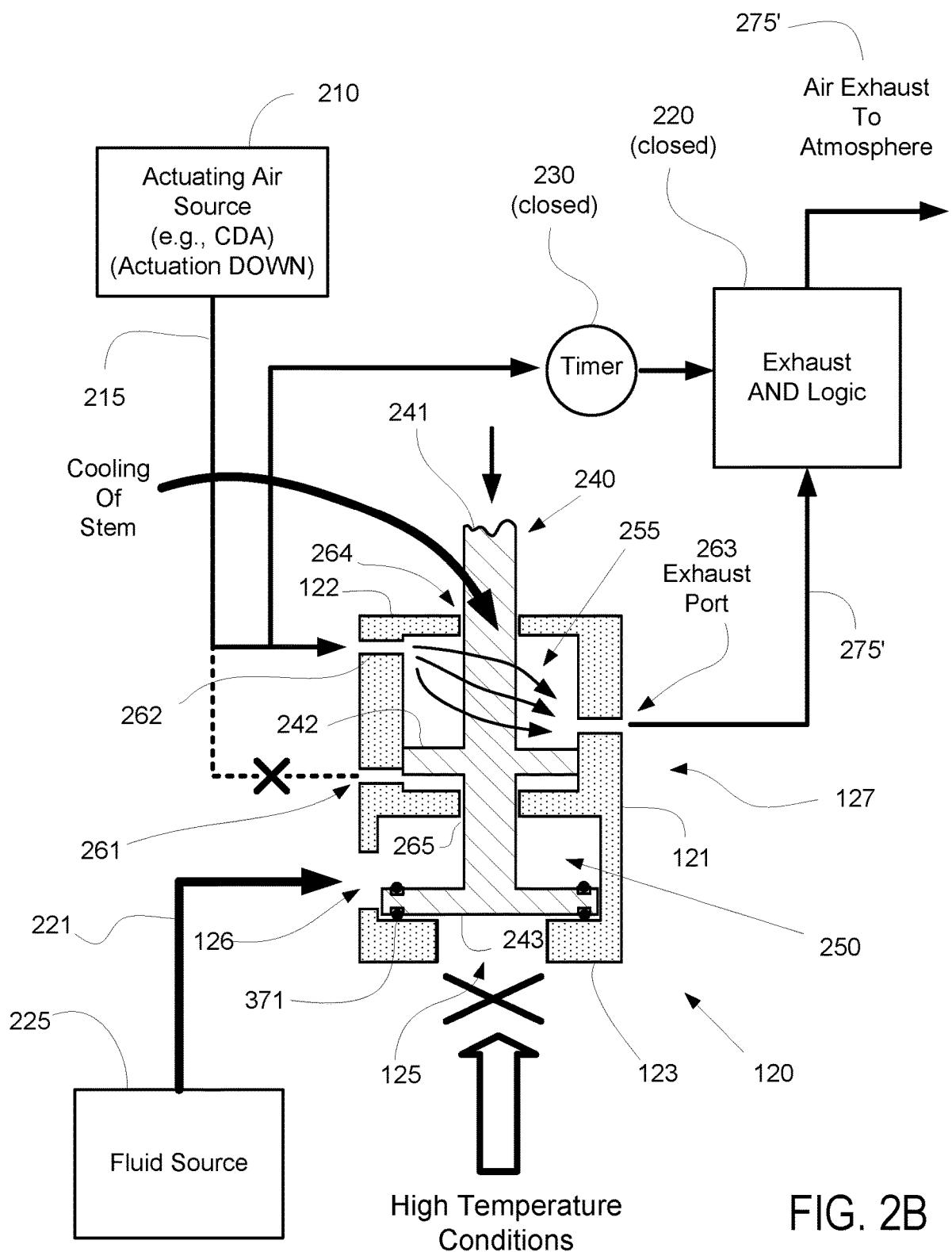
FIG. 2B is a diagram of a valve system configured for controlling fluid flow, wherein the valve is in a closed position, and wherein an actuating air flow cools the valve, in accordance with one embodiment of the present disclosure.

FIG. 2B is a diagram of valve system 200' configured for controlling flow of fluid, wherein a valve is in a closed position, and wherein an actuating air flow cools the valve, in accordance with one embodiment of the present disclosure. The valve system 200' shown in FIG. 2B is identical to the valve system 200 shown in FIG. 4 with identical components; however, the valve in FIG. 2B is allowed to exhaust actuating air used for closing the valve to atmosphere thereby allowing cooling of the valve, as opposed to FIG. 4 where the actuating air is prevented from exhausting to atmosphere.

In particular, the valve system 200' of FIG. 2B includes valve 120 configured for controlling flow of fluid 221. As shown, the valve 120 is actuated to a closed position using actuating air 215 from air source 210. In one embodiment, the actuating air is compressed dry air (CDA). As shown in FIG. 2B, when the valve 120 is in the closed position, actuating air 215 continues to flow and cool the valve 120, even though fluid 221 is prevented from exiting valve 120. More particularly, when the barrier 242 is similarly moved to the closed position, actuating air 215 continues to flow through the actuation cavity 255 between the third port 262 and the second port 263 (e.g., exhaust port) and exit the actuation cavity 255 as air exhaust 275'. In one embodiment, cooling flow 272 of the actuating air within the actuation cavity 255 cools the stem 241. The cooling flow 272 may be controlled for optimal cooling, such as duration of cooling flow 272, pressure of cooling flow 272, start time of cooling flow 272, end time of cooling flow 272, temperature of cooling flow 272, etc. Cooling of the stem 241 lowers the operating temperature of the valve 120, and more particularly lowers the temperature of the stem of poppet 240 and components in contact with the stem 241, such as sealing O-rings, the sealing housing 127*b*, the actuation housing 127*a*, etc.

In the configuration of FIG. 2B, timer 230 controls the delivery of actuating air 215 from the air source 210 to the exhaust logic 220. As previously described, exhaust logic 220 may be configured as AND logic, with a first input being actuating air 215 from the air source 210 and a second input being the air exhaust 275' from the second port 263 (e.g., exhaust port). For example, if additional actuating air 215 is necessary to fully actuate the poppet 240 and correspondingly valve 120 to the closed position, timer 230 (optional) and exhaust logic 220 are configured to control the exhausting of the actuating air 215 to the atmosphere as air exhaust 275'. Timer 230 is configured to control cooling (e.g., start and end of cooling, the cooling period, etc.) of the valve 120 when moving to and when in a closed position, and does not impede actuation. Timer 230 controls how long to prevent actuating air 215 from being received as an input to exhaust logic 220. In one implementation, as long as the timer is activated and has not expired, actuation air 215 is prevented from flowing as input to exhaust logic 220 when the valve 120 is moved to the closed position. As such, even though the second port 263 is exposed to the actuation cavity 255 above the barrier 242 thereby allowing actuating air 215 to exhaust, when the exhaust logic 220 is closed, air exhaust 275' is still prevented from flowing to atmosphere (e.g., channel leading to atmosphere is stagnant). Because exhaust logic 220 remains closed, the actuating air 215 continues to fill the actuation cavity 255 and acts to push the barrier 242 towards the common wall 124, thereby moving the poppet 240 to the closed position. That is, the pressure of the air exhaust 275' and the actuating air 215 continues to actuate the poppet 240 to the closed position. For example, it may be desired to allow for a longer period for actuating air 215 to actuate the poppet 240 to the fully closed position. Also, it may be desired to delay cooling of the stem 241 by preventing actuating air 215 as air exhaust 275' to exhaust to atmosphere through exhaust logic 220 (e.g., remains closed through operation of timer 230). Once the exhaust logic 220 opens, the actuating air 215 flows through the actuation cavity 255 as cooling flow 272 to cool the stem 241, exits as air exhaust 275', and passes through the exhaust logic 220 to the atmosphere. In another embodiment, timer 230 controls delivery of air exhaust 275' from the air exhaust port 263, instead of controlling actuating air 215 as input to the exhaust logic 220.

FIGS. 3A-3C are illustrations of the valve 120 shown in FIG. 2A as the valve is moving to an open position from a closed position, wherein the valve 120 controls flow of fluid 221, in accordance with one embodiment of the present disclosure. In FIG. 3A, the poppet 240 is in the closed position, such that stem 241 is linearly moved towards the bottom cap 123. In that manner, the sealing plunger 243 is resting against the bottom cap 123, and more particularly, O-ring 371 is in contact with both bottom cap 123 and the sealing plunger 243 to isolate the sealing cavity 250 from the exterior of valve 120. To move the poppet 240 (and valve 120) to the open position, actuating air 215 is introduced into the actuation cavity 255 through first port 261. As the actuating air 215 fills the space below barrier 242 in the actuation cavity 255, pressure moves the barrier 242 linearly towards top cap 122. In one embodiment, the actuating air 215 is CDA. In this implementation, as the actuating air fills the space below barrier 242 in the actuation cavity 255, the barrier 242 is moved linearly towards top cap 122. In one embodiment, in the closed position, actuating air 215 is not exhausted from the actuation cavity 255 as the second port 263 (e.g., exhaust port) is blocked from access by the position of the barrier 242.

In one implementation, the estimated time to open the valve 120 from a closed position is approximately 0.2 to 45 seconds. In another implementation, the estimated time to open the valve ranges between about 1 to 30 seconds. In another implementation, the estimated time to open the valve ranges between about 0.2 to 30 seconds. In another implementation, the estimated time to open the valve ranges between about 0.2 to 10 seconds. In other implementations, the estimated time to open the valve ranges between about 0.2 to 5 seconds. In another implementation, the estimated time to open the valve ranges between about 0.5 to 3 seconds. In one implementation, the estimated time to open the valve is approximately 2 seconds.

In FIG. 3B, the poppet 240 has moved to an intermediate position between a closed position and an open position. In particular, barrier 242 is being linearly moved away from common wall 124. Residual air remaining in the space of the actuating cavity 255 above barrier 242 may exhaust through a third port 262. In addition, sealing plunger 243 is being linearly moved away from bottom cap 123. As such, some flow of fluid 221 is able to flow from fluid inlet port 126 through sealing cavity 250 and out from fluid outlet port 125. As shown, actuating air 215 is still not being exhausted from the actuation cavity 255 as the second port 263 (e.g., exhaust port) continues to be blocked from access by the position of the barrier 242. In one embodiment, the configuration of the first port 261 and the second exhaust port 263 allows for full actuation of the valve 120 to the open position before fully exhausting actuating air 215 through second port 263 as air exhaust 275.

In FIG. 3C, the poppet 240 has moved to the fully open position, such as when the valve 120 is actuated UP. In particular, barrier 242 has been linearly moved away from common wall 124. In addition, sealing plunger 243 has been linearly moved away from bottom cap 123, and is resting against common wall 124. Specifically, O-ring 372 is in contact with both sealing plunger 243 and common wall 124, such that the sealing cavity 250 is now isolated from actuation cavity 255. That is, O-ring 372 seals opening 265 from the sealing cavity 250 when the poppet 240 is in the open position. O-ring 372 may be configured on an upper surface of the sealing plunger 243. In that manner, fluid 221 is prevented from entering into the actuation cavity 255 when the poppet and valve are in the open position. As such, when the valve 120 is in the fully open position, fluid 221 flows from fluid inlet port 126 through sealing cavity 250 and out from fluid outlet port 125 without restriction.

Additionally, actuating air 215 is now being exhausted from the actuation cavity 255 as the second port 263 (e.g., exhaust port) is now accessible, being located below the barrier 242. That is, the space of the actuation cavity 255 below barrier 242 is accessible by the second port 263. As previously described, full actuation of the valve 120 is performed before fully exhausting actuating air through second port 263 as air exhaust 275. As shown air exhaust 275 exits exhaust port 263. In one embodiment, when valve 120 is in the open position actuating air 215 continues to flow into the actuation cavity 255. Because actuating air 215 can be exhausted through second port 263 (e.g., exhaust port) as air exhaust 275, a cooling flow 270 is generated and can be used to cool the stem 241. In particular, the stem 241 of the poppet 240 acts as a heat sink. The surface area of the stem allows for heat dissipation, wherein heat is transferred from the stem 241 to the cooling flow 270 (e.g., through convection). In that manner, the temperature of stem 241 can be controlled by controlling the flow of the actuating air 215 in cooling flow 270. The flow of actuating air 215 can be controlled by controlling the exhausting pressure of the air. In addition, the period of cooling can be controlled through controlling the delivery of actuating air 215, during actuation and/or after full actuation of the valve 120, such as with timer 230.

In one embodiment, the actuating air 215 as CDA flows into the actuation cavity 255 and expands. Cooling of the actuating CDA may occur during expansion. Generally, and for purposes of simplicity and clarity, the expansion of actuating CDA lowers its temperature as it enters the actuation cavity 255 from first port 261. As the now expanded actuating CDA flows past stem 241 (e.g., acting as a heat sink), convection acts to transfer heat between the stem 241 and the cooling flow 270 of the actuating air or actuating CDA, before the actuating air or actuating CDA is exhausted from the actuation cavity 255 as air exhaust 275 to the atmosphere. In that manner, the temperature of stem 241 can be controlled by controlling the flow of the actuating air or actuating CDA in cooling flow 270, as described above. For example, the flow of actuating air or actuating CDA can be controlled by controlling the exhausting pressure of actuating air or actuating CDA, or by controlling the period of cooling through timer 230.

In one embodiment, the cooling of the stem 241 also leads to additional cooling of additional components in contact with the stem. For example, the operating temperature of O-ring 372 is reduced as it becomes cooled through cooling of stem 241. As shown, cooling of stem 241 leads to localized cooling of the sealing plunger 243 and O-ring 372, as well as O-ring 371. In addition, the operating temperature of the actuation housing 127*a* surrounding the actuation cavity 255 and/or the sealing housing 127*b* surrounding the sealing cavity 250 also becomes cooled through cooling of the stem 241, thereby leading to lower operating temperatures.

Figure 4:
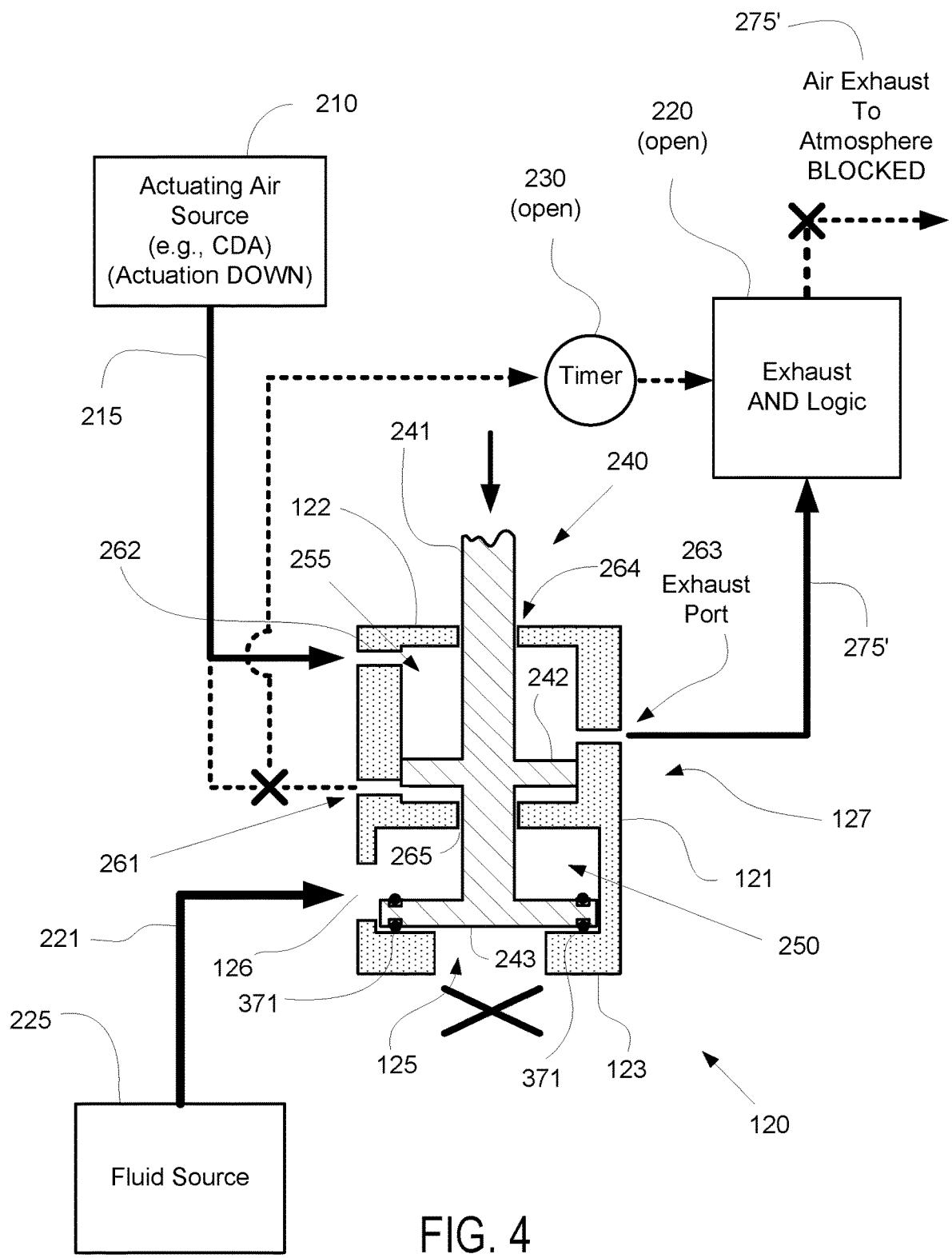
FIG. 4 is a diagram of a valve system configured for controlling fluid flow, wherein the valve is in a closed position, in accordance with one embodiment of the present disclosure.

FIG. 4 is a diagram of a valve system 200 configured to control fluid flow, wherein valve 120 is configured in a closed position, in accordance with one embodiment of the present disclosure. The valve system 200 shown in FIG. 4 is identical to the valve system 200 shown in FIG. 2A with identical components. As such, a full discussion of the components of the valve system 200 may be found in relation to FIG. 2A. The difference between the valve systems 200 in FIGS. 2A and 4 is the state of the valve, wherein the valve 120 is shown in an open position in FIG. 2A, and the valve is shown in a closed position in FIG. 4.

In particular, the valve system 200 includes valve 120 configured for controlling flow of fluid 221. As shown in FIG. 4, the valve 120 is actuated to a closed position using actuating air 215 from air source 210. In one embodiment, the actuating air is compressed dry air (CDA). As shown in FIG. 4, in the closed position, actuating air 215 is prevented from exhausting from the actuation chamber 127*a*, and as such does not act to cool the valve 120, and more particularly the stem 241.

As previously described, the valve includes a valve body 127 configured for controlling flow of fluid 221. A sealing housing 127*b* of the valve body 127 is configured for surrounding sealing cavity 250, and includes fluid inlet port 126 configured for entry of the fluid 221 and an fluid outlet port 125 configured for allowing exit of fluid from the sealing cavity 250.

The valve body 127 includes an actuation housing 127*a* surrounding actuation cavity 255. As previously described, actuation housing 127*a* includes common wall 124 separating the sealing cavity 250 from the actuation cavity 255, wherein opening 265 is located in the common wall 124. Opening 264 is configured within top cap 122 and is aligned with opening 265 in common wall 124 to facilitate travel of stem 241 of the poppet 240 through openings 264 and 265. Actuation housing 127*a* includes a third port 262 configured for entry of actuating air 215 used to move the poppet 240 to the closed position. As shown, the third port 262 is configured within the containing wall 121, and is configured for entry of actuating air 215 delivered from the air source 210. In one embodiment, actuating air is CDA. The second port 263 (e.g., exhaust port) is located within the containing wall 121, and is configured to allow actuating air 215 to exhaust from the actuation cavity 255 as air exhaust 275'.

The valve includes a poppet 240 configured for movement within the valve body 127. The poppet 240 is actuated to the closed position using the actuating air 215 entering in the third port 262, as delivered through accommodating piping/delivery system for DOWN actuation. In particular, when the valve 120 is in the closed position, the barrier 242 is pushed and/or linearly moved towards bottom cap 123 by actuating air 215, as will be further described in relation to FIGS. 5A-5B, and 5C-1. In one embodiment, the state of the valve 120 is maintained without continuous flow of actuation air. For example, the state of poppet 240 (e.g., open or closed position) within the valve body 127 remains static (e.g., through friction). As such, when barrier 242 is moved to the closed position, sealing plunger 243 is linearly moved to rest against the bottom cap 123, such that that the sealing plunger is positioned and configured to seal the fluid outlet port 125 from the sealing cavity 250 and prevent flow of fluid 221 through the sealing cavity 250 to exit from the fluid outlet port 125. O-ring 371 is configured on a lower surface of the sealing plunger 243, wherein the O-ring 371 is configured for sealing the RPC outlet port from the sealing cavity when the barrier is actuated to the closed position. That is, when barrier 242 is moved to the closed position O-ring 371 is in contact with both the bottom cap 123 and the sealing plunger 243, wherein the positioning of the O-ring 371 is such that the fluid outlet port 125 is sealed from the sealing cavity 250, thereby preventing flow of fluid 221 through the valve.

In one embodiment, actuating air 215 is prevented from exhausting to atmosphere, and as such, actuating air 215 does not act to cool the stem 241 and/or the valve 120. In one embodiment, the configuration of the third port 262 and the second port 263 (e.g., exhaust port) allows for full actuation of the valve 120 to the closed position. If additional actuating air 215 is necessary to fully actuate the poppet 240 and correspondingly valve 120 to the closed position, timer 230 (optional) and exhaust logic 220 are configured to control the exhausting of the actuating air 215 to the atmosphere as air exhaust 275'. In particular, exhaust logic 220 may be configured as AND logic, with a first input being actuating air 215 from the air source 210 and a second input being the air exhaust 275' from the second port 263 (e.g., exhaust port). As shown in FIG. 4, the first input to the timer 230 is blocked, thereby preventing exhaust logic 220 from opening and preventing air exhaust 275' from escaping to the atmosphere. That is, actuating air 215 provided for actuation-down is inactive as an input to the exhaust logic 220, and as such the passing of air exhaust 275' through the exhaust logic 220 is blocked. Even if the timer 230 were in operation, no input of actuating air 215 would be provided to the exhaust logic 220 in the configuration of FIG. 4 when the poppet 240 is moved to and remains in a closed position. When the exhaust logic 220 receives both inputs as being true (i.e., receives both actuating air 215 and air exhaust 275'), then the exhaust logic 220 opens to allow the air exhaust 275' to the atmosphere. Because exhaust logic 220 remains closed, the actuating air 215 continues to fill the actuation cavity 255 and acts to push the barrier 242 towards the common wall 124, thereby moving the poppet 240 to the closed position.

FIGS. 5A-5B, 5C-1, and 5C-2 are illustrations of the valve 120 shown in FIGS. 2B and 4 as the valve is moving to a closed position from an open position, wherein the valve 120 controls flow of fluid 221, in accordance with one embodiment of the present disclosure.

In one implementation, the estimated time to close the valve from a closed position is approximately 0.2 to 45 seconds. In another implementation, the estimated time to close the valve ranges between about 1 to 30 seconds. In another implementation, the estimated time to close the valve ranges between about 0.2 to 30 seconds. In another implementation, the estimated time to close the valve ranges between about 0.2 to 10 seconds. In other implementations, the estimated time to close the valve ranges between about 0.2 to 5 seconds. In another implementation, the estimated time to close the valve ranges between about 0.5 to 3 seconds. In one implementation, the estimated time to close the valve is approximately 2 seconds.

Figure 5A:
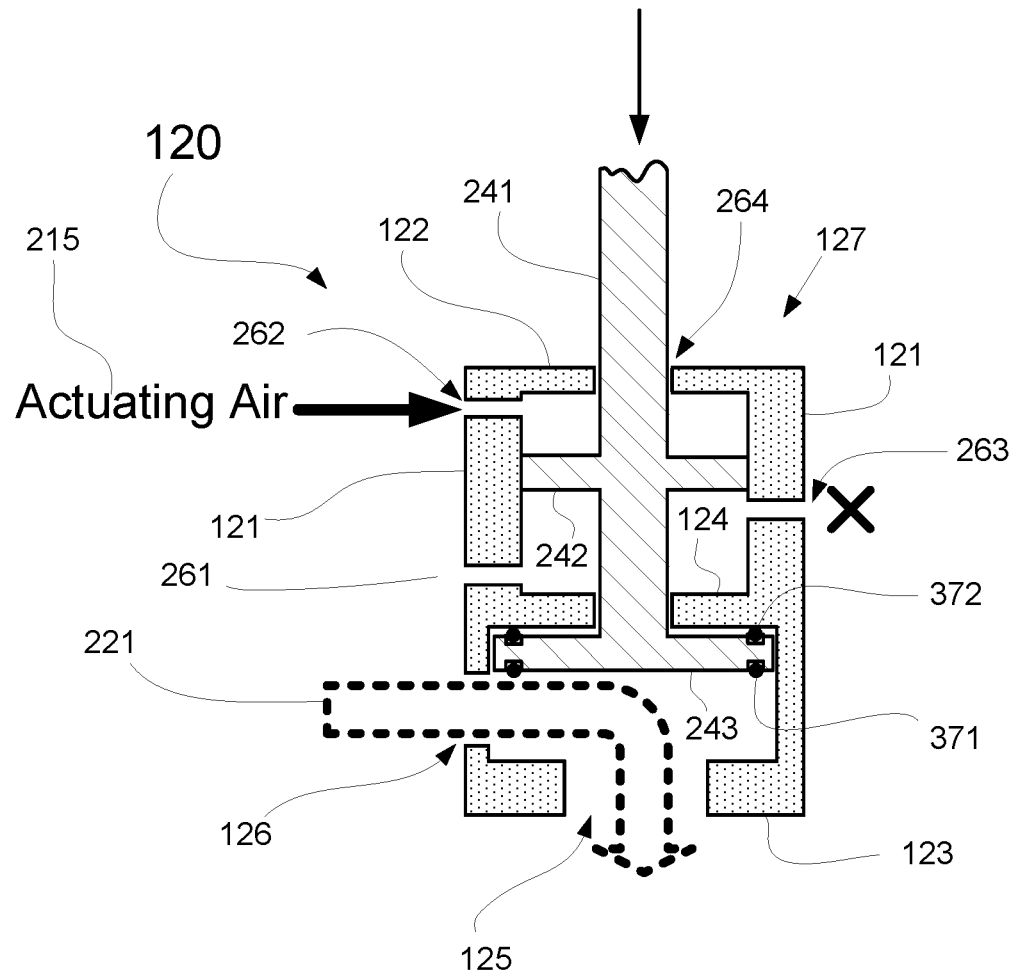
FIGS. 5A, 5B, 5C-1, and 5C-2 are illustrations of a valve controlling fluid flow as the valve is moving to a closed position as described in FIG. 2B, in accordance with one embodiment of the present disclosure.

In FIG. 5A, the poppet 240 is in the open position, such that stem 241 is linearly moved towards the top cap 122. In that manner, the sealing plunger 243 is resting against the common wall 124, and more particularly, O-ring 372 is in contact with both common wall 124 and the sealing plunger 243 to isolate the sealing cavity 250 from the actuation cavity 255. In that manner, fluid 221 is prevented from entering into the actuation cavity 255. When the valve 120 is in the fully open position, fluid 221 flows from fluid inlet port 126 through sealing cavity 250 and out from fluid outlet port 125 without restriction. To move the poppet 240 (and valve 120) to the closed position, actuating air 215 is introduced into the actuation cavity 255 through third port 262. As the actuating air 215 fills the space above barrier 242 in the actuation cavity 255, pressure moves the barrier 242 linearly towards common wall 124. In one embodiment, the actuating air 215 is CDA. In this implementation, as the actuating air fills the space above barrier 242 in the actuation cavity 255, the barrier 242 is moved linearly towards common wall 124. In one embodiment, in the open position, actuating air 215 entering from the third port 262 is not exhausted from the actuation cavity 255 as the second port 263 (e.g., exhaust port) is blocked from access by the position of the barrier 242.

Figure 5B:
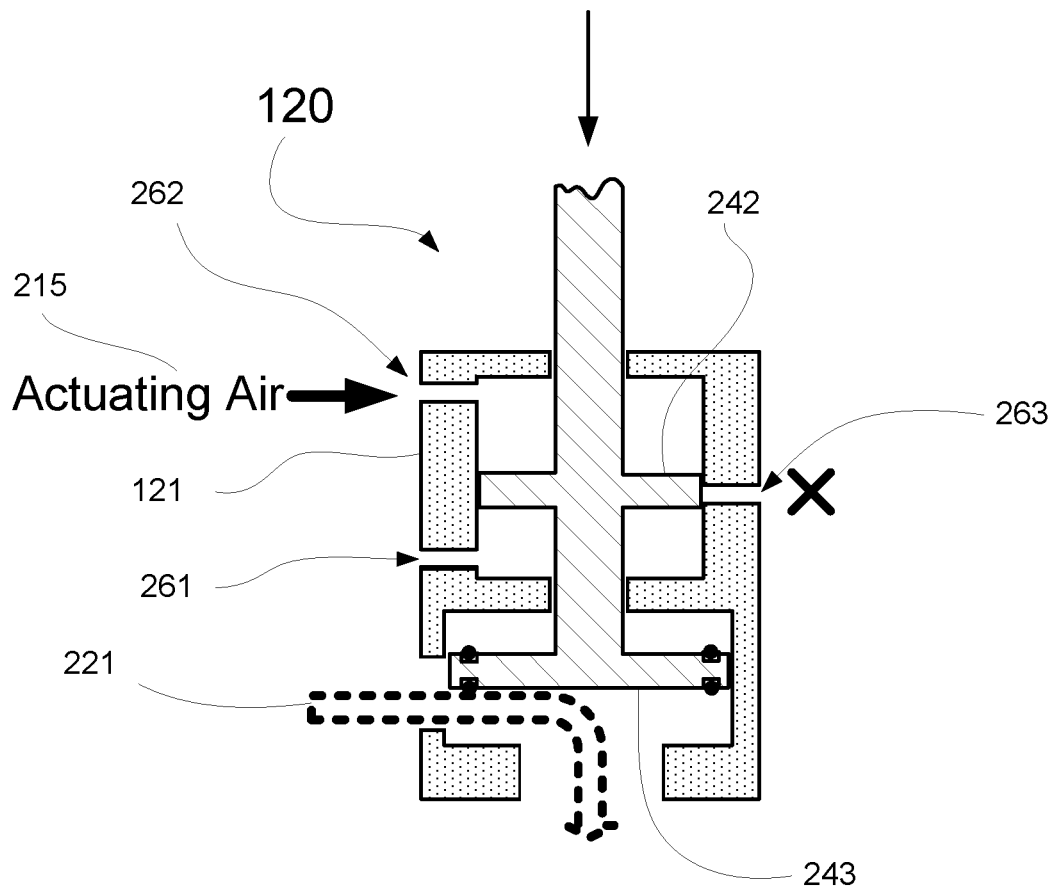

In FIG. 5B, the poppet 240 has moved to an intermediate position between a closed position and an open position. In particular, barrier 242 is being linearly moved towards common wall 124. Residual air remaining in the space of the actuating cavity 255 below barrier 242 may exhaust through the first port 261. In addition, sealing plunger 243 is being linearly moved towards bottom cap 123. As such, some flow of fluid 221 is able to flow from fluid inlet port 126 through sealing cavity 250 and out from fluid outlet port 125. As shown, actuating air 215 entering from the third port 262 is still not being exhausted from the actuation cavity 255 as the second port 263 (e.g., exhaust port) continues to be blocked from access by the position of the barrier 242. In one embodiment, the configuration of the first port 261 and the second exhaust port 263 allows for full actuation of the valve 120 to the closed position before fully exhausting actuating air 215 through second port 263 as air exhaust 275'. In other embodiments, a timer 230 (optional) is used to control actuation of the valve 120 to the closed position, and/or to control cooling of the valve 120 using actuating air 215.

Figures 1, 5C:
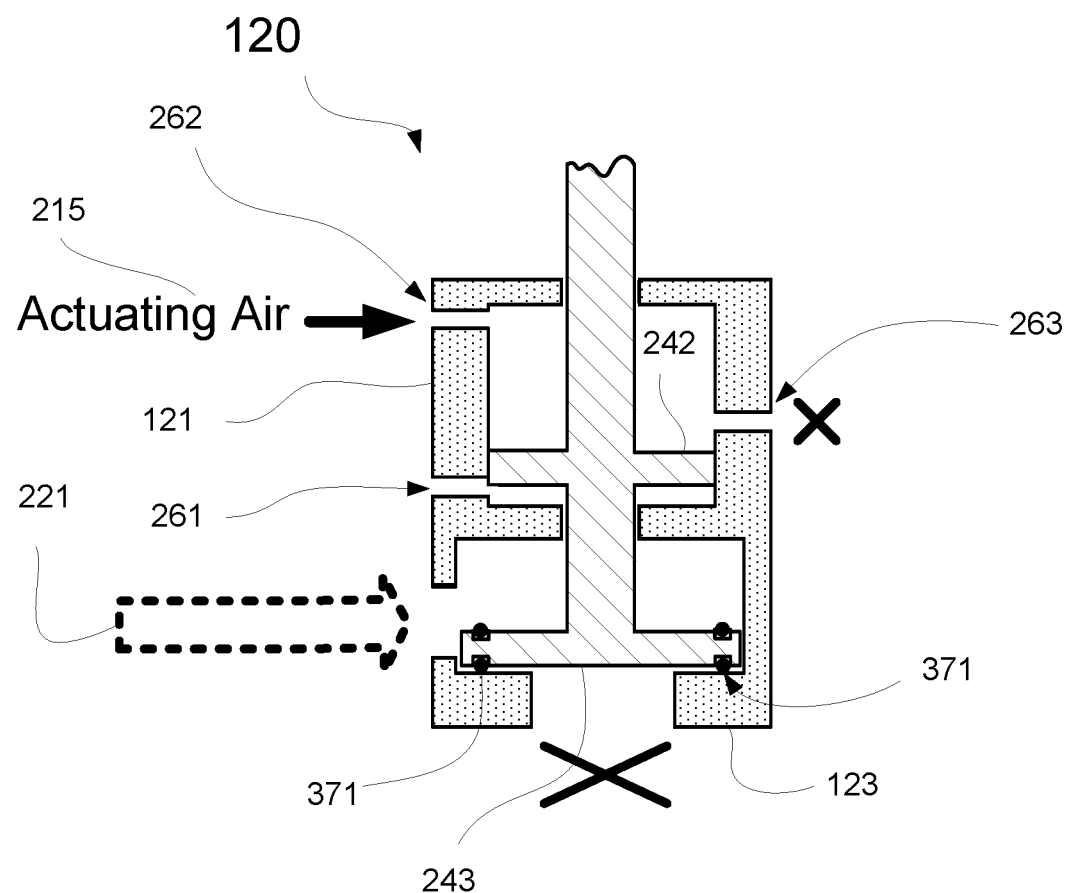
Figures 2, 5C:
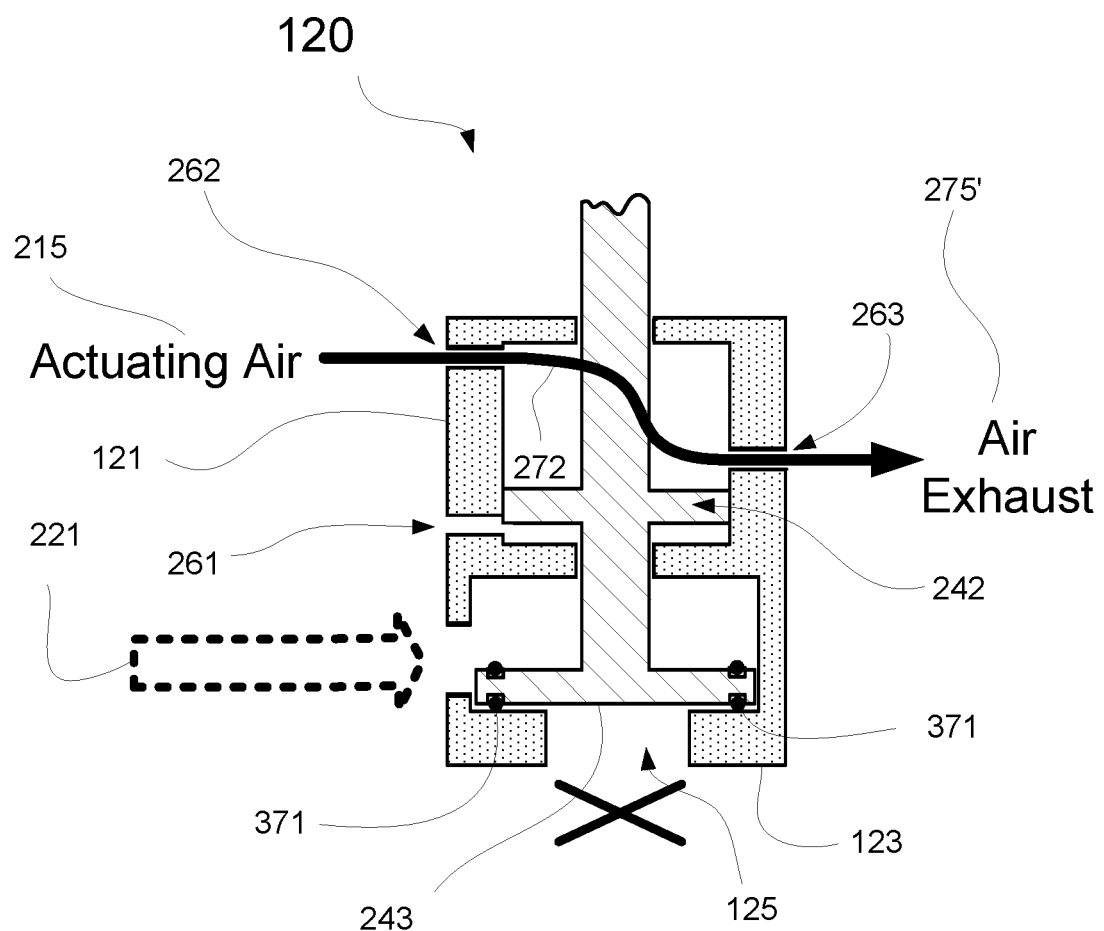

In FIGS. 5C-1 and 5C-2, the poppet 240 has moved to the fully closed position, such as when the valve 120 is actuated DOWN. In particular, barrier 242 has been linearly moved towards common wall 124. In addition, sealing plunger 243 is resting against bottom cap 123. Specifically, O-ring 371 is in contact with both sealing plunger 243 and bottom cap 123, such that the sealing cavity 250 is now isolated from fluid outlet port 125. In that manner, fluid 221 is prevented from flowing out from the fluid outlet port 125 when the valve 120 is in the fully closed position.

In FIG. 5C-1, actuating air 215 is prevented from exhausting to the atmosphere even after the valve 120 is fully actuated to a closed position. FIG. 5C-1 corresponds to FIG. 4. For example, exhaust logic 220 remains closed, as previously described. Because actuating air 215 is prevented from being exhausted, no cooling flow is generated.

In FIG. 5C-2, actuating air 215 exhausts to the atmosphere even after the valve 120 is fully actuated to a closed position. For example, exhaust logic 220 is now open, as previously described. Because actuating air 215 is being exhausted, cooling flow is generated. In particular, actuating air 215 entering from third port 262 is now being exhausted from the actuation cavity 255 as the second port 263 (e.g., exhaust port) is now accessible, being located above the barrier 242. That is, the space of the actuation cavity 255 above barrier 242 is accessible by the second port 263. As shown air exhaust 275' exits exhaust port 263. In one embodiment, when the valve 120 is in the closed position actuating air 215 continues to flow into the actuation cavity 255. Because actuating air 215 can be exhausted through second port 263 (e.g., exhaust port) as air exhaust 275', a cooling flow 272 is generated and can be used to cool the stem 241. In particular, heat is transferred from the stem 241 to the cooling flow 272. As such, the temperature of stem 241 can be controlled by controlling the flow of the actuating air 215 in cooling flow 272. The flow of actuating air 215 can be controlled by controlling the exhaust pressure of the air. In addition, the period of cooling can be controlled through controlling the delivery of actuating air 215, during actuation and/or after full actuation of the valve 120, such as with timer 230. In one embodiment, the actuating air 215 is CDA, which cools upon expansion into the actuation cavity 255, as previously described. As the now expanded actuating air flows past stem 241 (acting as a heat sink), convection acts to transfer heat between the stem 241 and the cooling flow 270 of the actuating CDA, before the actuating CDA is exhausted from the actuation cavity 255 as air exhaust 275 to the atmosphere.

In one embodiment, the cooling of the stem 241 also leads to additional cooling of additional components in contact with the stem. For example, the operating temperature of O-ring 372 is reduced as it becomes cooled through cooling of stem 241. As shown, cooling of stem 241 leads to localized cooling of the sealing plunger 243 and O-ring 372, as well as O-ring 371. In addition, the operating temperature of the actuation housing 127a surrounding the actuation cavity 255 and/or the sealing housing 127b surrounding the sealing cavity 250 also becomes cooled through cooling of the stem 241, thereby leading to lower operating temperatures.

Figure 6:
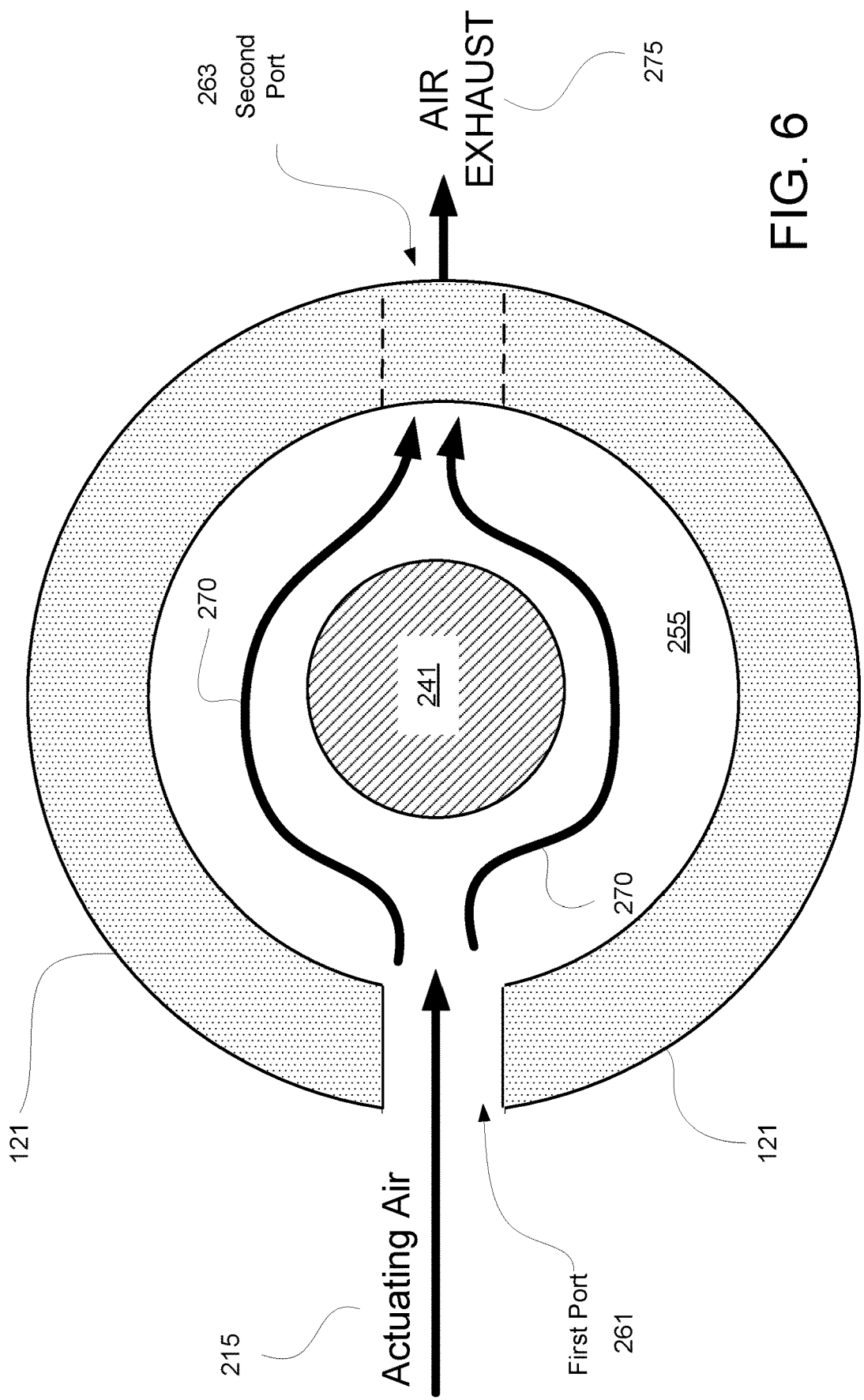
FIG. 6 is a cut-away view from a top of a first configuration of a valve configured for controlling fluid flow, wherein in either an open or closed position, an actuating air flow cools the interior of the valve, in accordance with one embodiment of the present disclosure.

FIG. 6 is a cut-away view from a top of a first configuration of valve 120 configured for controlling flow of fluid, wherein in an open and or closed position of the valve 120, actuating air that is exhausted through the second port 263 (e.g., exhaust port) cools the interior of the valve 120, in accordance with one embodiment of the present disclosure. For example, cooling flow 270 transfers heat from the stem 241 of the poppet 240 of the valve to the actuating air 215 before being exhausted from the actuation cavity 255 through the second port 263 as air exhaust 275. As shown in FIG. 6, the containing wall 121 of the valve body 127 is cylindrical (e.g., circular) in shape, in one embodiment.

Figure 7:
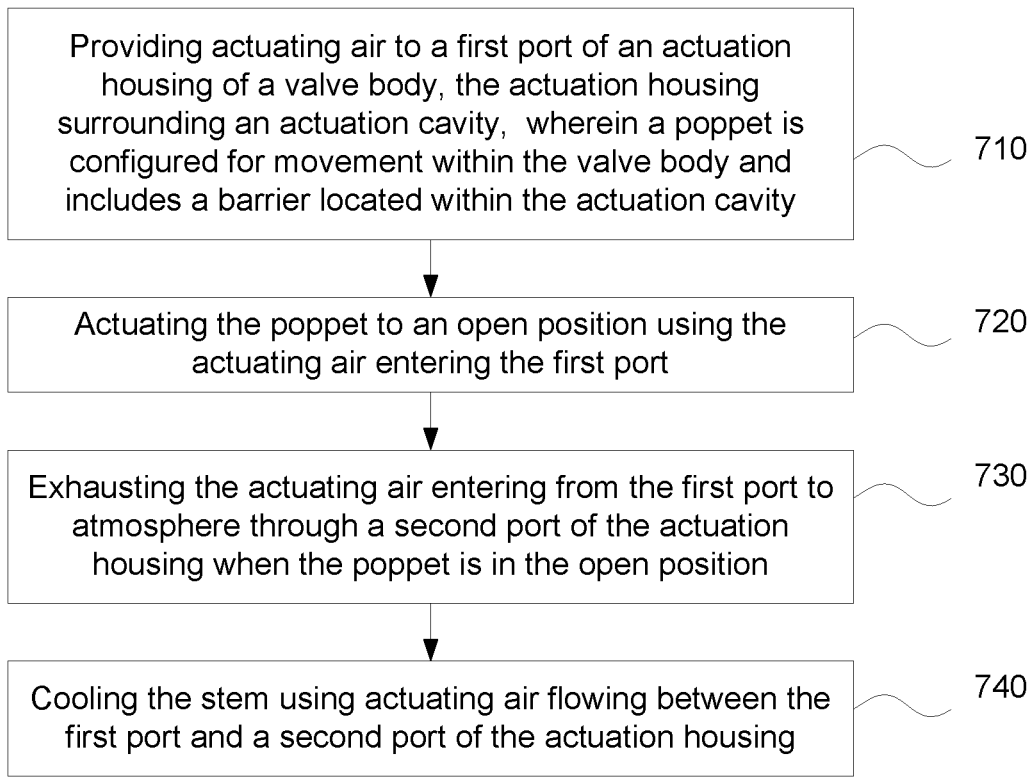
FIG. 7 is a flow diagram illustrating a method for cooling a valve that is configured for controlling fluid flow using actuating air, in accordance with one embodiment of the present disclosure.

FIG. 7 is a flow diagram illustrating a method for operating a valve controlling fluid flow, in accordance with one embodiment of the present disclosure. In particular, the method may include cooling the valve using actuating air. The method of flow diagram 700 may be applied by the plasma processing modules 100 of FIG. 1A, and the systems described in FIGS. 2A-2B, and 4.

At 710, the method includes providing actuating air to a first port of an actuation housing of a valve body of a valve. The valve body includes an actuation housing surrounding an actuation cavity. A poppet is configured for movement within the valve body and includes a barrier located within the actuation cavity.

At 720, the method includes actuating the poppet and correspondingly the valve to an open position using the actuating air entering the first port. For instance, the barrier of the poppet is actuated by actuating air to the open position, wherein the actuating air enters from the first port in the valve body. The barrier is configured for linear movement within the actuation cavity.

At 730, the method includes exhausting the actuating air entering from the first port to atmosphere through a second port of the actuation housing when the poppet is in the open position.

At 740, the method includes cooling the stem using actuating air flowing between the first port and a second port of the actuation housing. In particular, as the actuating air is exhausted, a cooling flow is generated within the actuation cavity that acts to cool the stem of the poppet. That is, when the valve is in the open position, cooling of the stem is performed by flowing the actuating air through the actuation cavity between the first port and the second port of the actuation housing.

In one embodiment, the method includes providing fluid to an inlet port of a sealing housing of the valve body, the sealing housing surrounding a sealing cavity. The valve body being configured for controlling flow of the fluid. The inlet port is configured for entry of the fluid into the sealing housing. In one embodiment, the fluid is RPC, such as a cleaning mixture. The sealing housing also includes an outlet port configured for exit of the fluid from the sealing cavity. A common wall of the sealing housing and the actuation housing separates the sealing cavity from the actuation cavity. In addition, the stem of the poppet connects a sealing plunger located within the sealing cavity to the barrier located within the actuation cavity through a first opening in the common wall. When being actuated, linear movement of the barrier of the poppet is translated to linear movement of the sealing plunger within the sealing cavity via the stem that is configured for travel through the first opening. When the poppet and correspondingly the valve are in the open position, the method includes positioning the sealing plunger to seal the first opening from the sealing cavity and allow flow of fluid through the sealing cavity from the inlet port to the outlet port.

In one embodiment, the cooling of the stem is delayed. For example, cooling is delayed to ensure full actuation of the barrier of the poppet and correspondingly the valve to the open position. In another embodiment, control over the cooling process is performed by controlling the exhaust of the actuation air from the actuation cavity to atmosphere. As such, even though the valve is fully actuated to an open position, cooling may be further delayed by a desired period.

In one embodiment, cooling of the stem occurs when the valve is in a closed position. That is, when the fluid is prevented from exiting the valve, additional cooling of the valve is performed. In particular, the method includes actuating the barrier of the poppet to a closed position using the actuating air. The actuating air enters from a third port in the valve body. The barrier is configured for linear movement within the actuation cavity, wherein linear movement of the barrier is translated to linear movement of the sealing plunger within the sealing cavity via the stem configured for travel through the first opening. As such, when the valve is in the closed position the method includes positioning the sealing plunger to seal the outlet port from the sealing cavity and prevent flow of fluid through the sealing cavity to the outlet port. The method includes exhausting the actuating air entering in from the third port to atmosphere through a second port of the actuation housing when the poppet is in the closed position. The method includes cooling the stem by flowing the actuating air through the actuation cavity between the third port and the second port of the actuation housing when the valve is in the closed position. That is, the valve can be configured to cool the stem in the open and/or closed position as needed.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A valve for fluid control in a plasma processing system, comprising:
   an actuation housing of a valve body and surrounding an actuation cavity, the actuation housing including a first inlet port and a second inlet port each configured for entry of actuating air, and an exhaust port configured for exhausting the actuating air, wherein the valve body includes a top cap and a bottom cap and a wall, wherein each of the first inlet port and the second inlet port and the exhaust port is located on the wall; and
   a poppet configured for linear movement within the valve body between the top cap and the bottom cap and including a barrier located within the actuation cavity, the poppet being actuated to an open position using the actuating air entering in the first inlet port, and the poppet being actuated to a closed position using the actuating air entering in the second inlet port;

wherein when the poppet is in the open position, the barrier is fully positioned between the second inlet port and the exhaust port in the actuation housing providing a first flow path for the actuating air to flow between the first inlet port and the exhaust port for cooling a stem of the poppet that is connected to opposing surfaces of the barrier that is configured to linearly move the stem using the actuating air, wherein when the poppet is in the closed position, the barrier is fully positioned between the first inlet port and the exhaust port in the actuation housing providing a second flow path for the actuating air to flow between the second inlet port and the exhaust port for cooling the stem of the poppet, a sealing housing of the valve body surrounding a sealing cavity, the valve body configured for controlling flow of a fluid, the sealing housing including a third inlet port configured for entry of the fluid into the sealing cavity of the sealing housing and an outlet port configured for exit of the fluid from the sealing cavity;

wherein a common wall of the actuation housing and the sealing housing separates the sealing cavity from the actuation cavity, wherein the stem of the poppet is configured to connect a sealing plunger located within the sealing cavity to the barrier through a first opening in the common wall, and an O-ring configured on an upper surface of the sealing plunger, wherein the O-ring is configured for sealing the first opening from the sealing cavity when the poppet is actuated to the open position.

2. The valve of claim 1, wherein the barrier is configured for linear movement within the actuation cavity as actuated by the actuating air, wherein the linear movement of the barrier is translated to linear movement of the sealing plunger within the sealing cavity via the stem configured for travel through the first opening.

3. The valve of claim 1, wherein when the poppet is in the open position, the sealing plunger is positioned to seal the first opening from the sealing cavity and allow flow of the fluid through the sealing cavity from the third inlet port to the outlet port.

4. The valve of claim 1, wherein the actuating air is compressed dry air (CDA).

5. The valve of claim 1, wherein the fluid comprises plasma from a remote source.

6. The valve of claim 1, further comprising:
wherein the poppet is configured for actuation by the actuating air to the closed position, the actuating air entering the actuation cavity from the second inlet port to actuate the poppet to the closed position,
wherein when the barrier is in the closed position, the sealing plunger is positioned and configured to seal the outlet port from the sealing cavity and prevent flow of a plasma through the sealing cavity to a process chamber,
wherein the actuating air is blocked from exhausting through the exhaust port by the barrier when the poppet is moving from the open position to the closed position,
wherein once the poppet is in the closed position, the poppet is configured to statically remain in the closed position.

7. The valve of claim 6, further comprising:
another O-ring configured on a lower surface of the sealing plunger, wherein the another O-ring is configured for sealing the outlet port from the sealing cavity when the barrier is actuated to the closed position.

8. The valve of claim 1,
wherein the stem of the poppet includes a first portion extending from a top surface of the barrier and a second portion extending from a bottom surface of the barrier, wherein the opposing surfaces of the barrier include the top surface and the bottom surface, wherein when
the poppet is in the open position, the actuating air flows along the first flow path to directly cool the first portion of the stem of the poppet that is exposed to the actuating air,
wherein when the poppet is in the closed position, the actuating air flows along the second flow path to directly cool the second portion of the stem of the poppet that is exposed to the actuating air.

9. A method for fluid control in a plasma processing system, comprising:
providing actuating air to a first inlet port of an actuation housing of a valve body, the actuation housing surrounding an actuation cavity, the actuation housing including the first inlet port and a second inlet port each configured for entry of the actuating air, wherein the valve body includes a top cap and a bottom cap and a wall, wherein each of the first inlet port and the second inlet port and an exhaust port is located on the wall, wherein a poppet is configured for linear movement within the valve body between the top cap and the bottom cap and includes a barrier located within the actuation cavity; and
actuating the poppet to an open position using the actuating air entering the first inlet port so that the barrier is fully positioned between the second inlet port and the exhaust port in the actuation housing, and the poppet being actuated to a closed position using the actuating air entering in the second inlet port;
exhausting via a first flow path the actuating air entering from the first inlet port to atmosphere through the exhaust port of the actuation housing when the poppet is in the open position;
cooling a stem of the poppet using the actuating air flowing between the first inlet port and the exhaust port of the actuation housing when the poppet is in the open position, wherein the stem of the poppet is connected to opposing surfaces of the barrier that is configured to linearly move the stem of the poppet using the actuating air,
wherein when the poppet is in the closed position so that the barrier is fully positioned between the first inlet port and the exhaust port in the actuation housing, the actuating air flowing between the second inlet port and the exhaust port via a second flow path cools the stem of the poppet, and
providing fluid to a third inlet port of a sealing housing of the valve body, the sealing housing surrounding a sealing cavity, the valve body configured for controlling flow of the fluid, the third inlet port being configured for entry of the fluid into the sealing cavity of the sealing housing, wherein the sealing housing includes an outlet port configured for exit of the fluid from the sealing cavity, wherein a common wall of the actuation housing and the sealing housing separates the sealing cavity from the actuation cavity;
wherein the stem of the poppet is configured to connect a sealing plunger located within the sealing cavity to the barrier located within the actuation cavity through a first opening in the common wall, positioning the sealing plunger when the barrier of the poppet is in the open position to seal the first opening from the sealing cavity using an O-ring configured on an upper surface of the sealing plunger and allow the flow of the fluid through the sealing cavity from the third inlet port to the outlet port.

10. The method of claim 9, wherein the fluid comprises plasma from a remote source.

11. The method of claim 9, further comprising:
actuating the barrier to the open position using the actuating air,
wherein linear movement of the barrier is translated to linear movement of the sealing plunger within the sealing cavity via the stem configured for travel through the first opening.

12. The method of claim 11, further comprising:
delaying the cooling of the stem to ensure full actuation of the barrier to the open position.

13. The method of claim 9, wherein the actuating air is compressed dry air (CDA).

14. The method of claim 9, further comprising:
actuating the barrier of the poppet to the closed position using the actuating air entering the second inlet port of the actuation housing, wherein linear movement of the barrier is translated to linear movement of the sealing plunger within the sealing cavity via the stem configured for travel through the first opening; and
positioning the sealing plunger, when the barrier is in the closed position, to seal the outlet port from the sealing cavity and prevent the flow of the fluid through the sealing cavity to the outlet port,
wherein the actuating air is blocked from exhausting through the exhaust port by the barrier when the poppet is moving from the open position to the closed position,
wherein once the poppet is in the closed position, the poppet is configured to statically remain in the closed position.

15. The method of claim 14, further comprising:
exhausting the actuating air entering in from the second inlet port to the atmosphere through the exhaust port of the actuation housing when the poppet is in the closed position; and
cooling the stem using the actuating air flowing between the second inlet port and the exhaust port of the actuation housing via the second flow path.

16. The method of claim 15, further comprising:
delaying the cooling of the stem via the second flow path to ensure full actuation of the barrier to the closed position.

17. The method of claim 9,
wherein the stem of the poppet includes a first portion extending from a top surface of the barrier and a second portion extending from a bottom surface of the barrier, wherein the opposing surfaces of the barrier include the top surface and the bottom surface, wherein when,
the poppet is in the open position, the actuating air flows along the first flow path to directly cool the first portion of the stem of the poppet that is exposed to the actuating air,
wherein when the poppet is in the closed position, the actuating air flows along the second flow path to directly cool the second portion of the stem of the poppet that is exposed to the actuating air.

\* \* \* \* \*